(12) United States Patent
Li et al.

(10) Patent No.: US 12,160,078 B2
(45) Date of Patent: Dec. 3, 2024

(54) OPTICALLY-PUMPED SEMICONDUCTOR WAVEGUIDE AMPLIFIER

(71) Applicant: University of Central Florida Research Foundation, Inc., Orlando, FL (US)

(72) Inventors: Guifang Li, Orlando, FL (US); Patrick LiKamWa, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 754 days.

(21) Appl. No.: 17/164,652

(22) Filed: Feb. 1, 2021

(65) Prior Publication Data

US 2021/0242653 A1 Aug. 5, 2021

Related U.S. Application Data

(60) Provisional application No. 62/967,726, filed on Jan. 30, 2020.

(51) Int. Cl.
| | |
|---|---|
| *H01S 3/067* | (2006.01) |
| *H01S 3/094* | (2006.01) |
| *H01S 3/16* | (2006.01) |
| *H01S 5/026* | (2006.01) |
| *H01S 5/04* | (2006.01) |
| *H01S 5/10* | (2021.01) |

(52) U.S. Cl.
CPC ...... *H01S 3/06754* (2013.01); *H01S 3/06716* (2013.01); *H01S 3/094011* (2013.01); *H01S 3/1628* (2013.01); *H01S 5/041* (2013.01); *H01S 5/026* (2013.01); *H01S 5/1014* (2013.01)

(58) Field of Classification Search
None
See application file for complete search history.

(56) References Cited

U.S. PATENT DOCUMENTS

| 6,175,446 B1 | 1/2001 | Alphonse |
| 6,661,830 B1 | 12/2003 | Reed et al. |
| 7,826,511 B1 * | 11/2010 | Yap ......................... H01S 5/028 372/75 |

(Continued)

OTHER PUBLICATIONS

Stephens et al., "Wavelength conversion at 40 Gbit/s via four wave mixing in semiconductor optical amplifier with integrated pump laser", Electronics Letters, Mar. 4, 1999, vol. 35, No. 5. (Year: 1999).*

(Continued)

*Primary Examiner* — Eric L Bolda
(74) *Attorney, Agent, or Firm* — Suiter Swantz IP

(57) ABSTRACT

A power semiconductor waveguide optical amplifier (P-SWA) may include an amplifier waveguide with an invertible core formed from one or more undoped heterogeneous semiconductor layers and one or more cladding layers surrounding one or more sides of the invertible core formed as one or more undoped semiconductor layers. Pump light may be coupled into the amplifier waveguide to induce the population inversion in the invertible core. Signal light may further be coupled into the amplifier waveguide and may be amplified as it propagates through the amplifier waveguide. The signal light may then exit the amplifier waveguide as amplified signal light.

16 Claims, 17 Drawing Sheets

(56) References Cited

U.S. PATENT DOCUMENTS

| | | | | |
|---|---|---|---|---|
| 2002/0171919 | A1* | 11/2002 | Blauvelt | H01S 5/026 |
| | | | | 359/344 |
| 2003/0012246 | A1* | 1/2003 | Klimek | H01S 5/18 |
| | | | | 359/345 |
| 2003/0026312 | A1* | 2/2003 | Clayton | H01S 5/041 |
| | | | | 372/50.1 |
| 2004/0032647 | A1* | 2/2004 | Wasserbauer | H01S 5/50 |
| | | | | 359/344 |
| 2009/0116805 | A1* | 5/2009 | Rice | H01S 5/50 |
| | | | | 385/131 |
| 2010/0150193 | A1* | 6/2010 | Bhat | H01S 5/20 |
| | | | | 372/44.01 |
| 2016/0156147 | A1* | 6/2016 | Raino | G02B 6/1228 |
| | | | | 977/774 |

OTHER PUBLICATIONS

Baghban, H. et al., "Quantum dot semiconductor optical amplifiers: optical pumping versus electrical pumping," J. Opt. 13 035406 (2011), 10 pages.

Chilla, J.L.A. et al., (2004). "High power optically pumped semiconductor lasers", Proc. SPIE. 5332. 10.1117/12.549003, (2004), 9 pages.

Eisenstein, G. et al., "Gain saturation characteristics of 1.5-μm multiple quantum well optical amplifiers", Optical Fiber Communication, OSA Technical Digest (Optical Society of America, 1990), paper THB4, 1 page.

http://www.hxopto.com/upload/980.pdf, ("980 nm High power FP Laser Diode EPI-Wafer from Huaxing Opto"), downloaded Jan. 18, 2021, 1 page.

Huang, X. et al., "Optimized Quantum-Well Semiconductor Optical Amplifier for RZ-DPSK Signal Regeneration," IEEE Journal of Quantum Electronics, vol. 47, No. 6, pp. 819-826, Jun. 2011, doi: 10.1109/JQE.2011.2123082.

Juodawlkis, P.W. et al., "High-power 1.5-μm InGaAsP—InP slab-coupled optical waveguide amplifier," in IEEE Photonics Technology Letters, vol. 17, No. 2, pp. 279-281, Feb. 2005, doi: 10.1109/LPT.2004.839770.

Koonath, P. et al., "Polarization-insensitive quantum-well semiconductor optical amplifiers", IEEE Journal of Quantum Electronics, vol. 38, No. 9, pp. 1282-1290, Sep. 2002, doi: 10.1109/JQE.2002.802445.

Morito, K. et al., "A broad-band MQW semiconductor optical amplifier with high saturation output power and low noise figure," IEEE Photonics Technology Letters, vol. 17, No. 5, pp. 974-976, May 2005, doi: 10.1109/LPT.2005.845733.

Morito, K. et al., "High-output-power polarization-insensitive semiconductor optical amplifier," Journal of Lightwave Technology, vol. 21, No. 1, pp. 176-181, Jan. 2003.

Phelan Jr., R.J. et al., "Optically Pumped Semiconductor Laser," Appl. Phys. Lett. 6 (4), 1965, 3 pages.

Wang, T. et al., "High-Power Optically Pumped Semiconductor Laser at 1040 nm," in IEEE Photonics Technology Letters, vol. 22, No. 9, pp. 661-663, May 1, 2010, doi: 10.1109/LPT.2010.2043731.

* cited by examiner

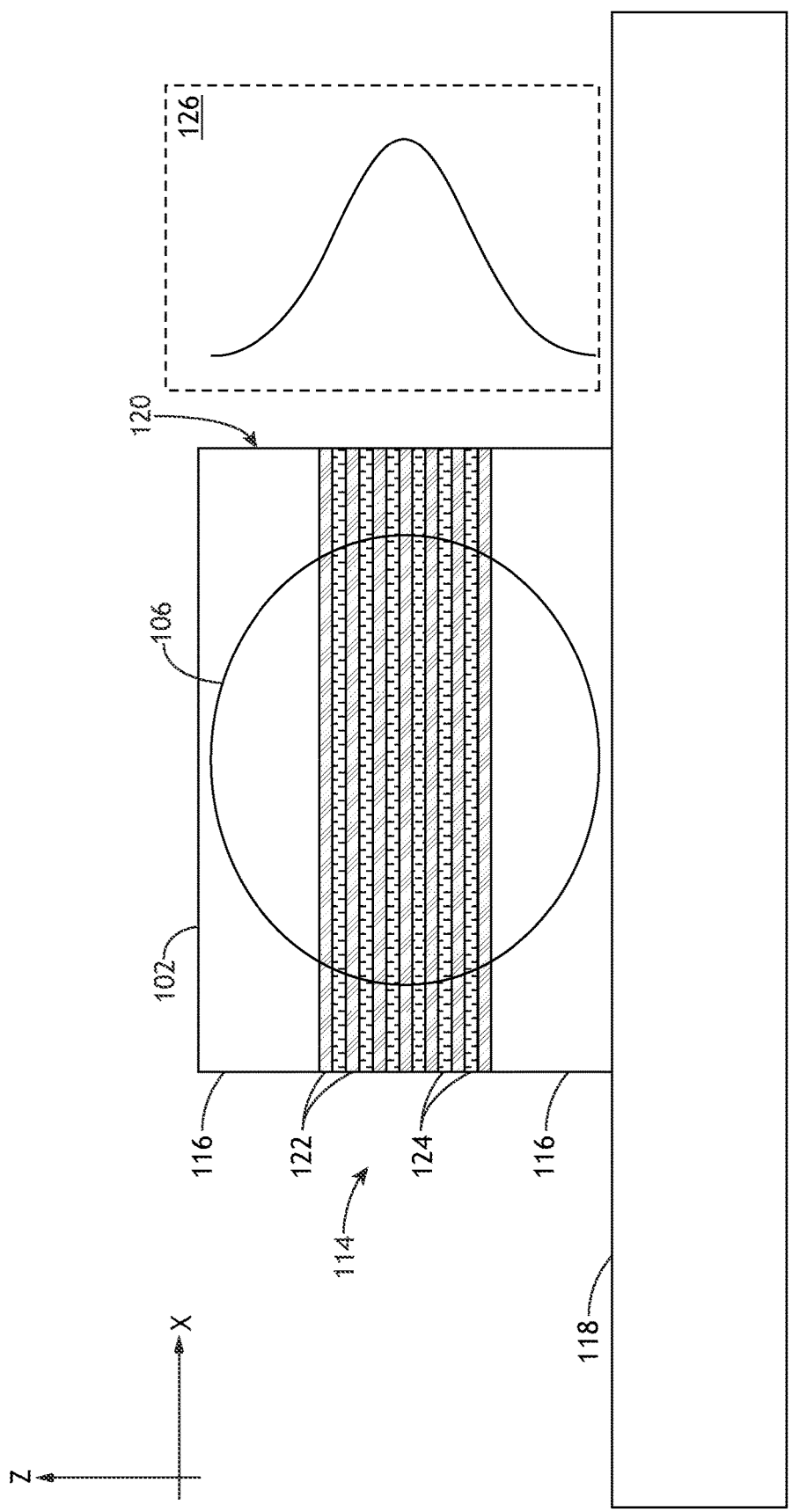

OPTICALLY-PUMPED SEMICONDUCTOR WAVEGUIDE AMPLIFIER

CROSS-REFERENCE TO RELATED APPLICATION

The present application claims the benefit under 35 U.S.C. § 119(e) of U.S. Provisional Application Ser. No. 62/967,726, filed Jan. 30, 2020, entitled WIDE-BANDWIDTH LOW-NOISE SEMICONDUCTOR OPTICAL AMPLIFIER, naming Guifang Li and Patrick LiKamWa as inventors, which is incorporated herein by reference in the entirety.

TECHNICAL FIELD

The present disclosure is related generally to optical amplifiers and, more particularly, to optically-pumped semiconductor waveguide amplifiers.

BACKGROUND

Electrically-pumped optical amplifiers such as semiconductor optical amplifiers (SOAs) may be formed as doped multilayer heterostructure devices using semiconductor fabrication techniques and are well-suited for direct integration with other components in a photonic integrated circuit. Such amplifiers also typically benefit from a compact size and wide optical bandwidths over which amplification may occur. However, the limits on the doping levels in these structures impose practical limits on the achievable optical gain and corresponding noise levels. As a result, fiber-based amplifiers utilizing optical pumping such as erbium-doped fiber amplifiers (EDFAs) typically outperform SOAs but suffer from relatively larger sizes and a lack of direct integration into photonic integrated circuits. Therefore, it is desirable to provide systems and methods that cure the above deficiencies.

SUMMARY

An optical amplifier is disclosed in accordance with one or more illustrative embodiments of the present disclosure. In one illustrative embodiment, the optical amplifier includes an amplifier waveguide. In another illustrative embodiment, the amplifier waveguide includes an invertible core formed from one or more undoped heterogeneous semiconductor layers. In another illustrative embodiment, the amplifier waveguide includes one or more cladding layers surrounding one or more sides of the invertible core formed as one or more undoped semiconductor layers. In another illustrative embodiment, the pump light is coupled into the amplifier waveguide to induce a population inversion in the invertible core. In another illustrative embodiment, signal light propagates through the amplifier waveguide, is amplified as it propagates through the amplifier waveguide and exits the amplifier waveguide as amplified signal light.

An optical amplifier is disclosed in accordance with one or more illustrative embodiments of the present disclosure. In one illustrative embodiment, the optical amplifier includes one or more pump sources to generate pump light, where the one or more pump sources comprise multilayer structures on a substrate. In another illustrative embodiment, the optical amplifier includes an amplifier waveguide on the substrate. In another illustrative embodiment, the amplifier waveguide includes an invertible core formed from one or more undoped heterogeneous semiconductor layers. In another illustrative embodiment, the amplifier waveguide includes one or more cladding layers surrounding one or more sides of the invertible core formed as one or more undoped semiconductor layers. In another illustrative embodiment, the pump light is coupled into the amplifier waveguide to induce a population inversion in the invertible core. In another illustrative embodiment, signal light propagates through the amplifier waveguide, is amplified as it propagates through the amplifier waveguide and exits the amplifier waveguide as amplified signal light.

A laser source is disclosed in accordance with one or more illustrative embodiments of the present disclosure. In one illustrative embodiment, the laser source includes a signal source to generate signal light. In another illustrative embodiment, the signal source comprises a multilayer structure on a substrate. In another illustrative embodiment, the laser source includes one or more pump sources to generate pump light. In another illustrative embodiment, the one or more pump sources comprise multilayer structures on the substrate. In another illustrative embodiment, the laser source includes an amplifier waveguide on the substrate. In another illustrative embodiment, the amplifier waveguide includes an invertible core formed from one or more undoped heterogeneous semiconductor layers. In another illustrative embodiment, the amplifier waveguide includes one or more cladding layers surrounding one or more sides of the invertible core formed as one or more undoped semiconductor layers. In another illustrative embodiment, the pump light is coupled into the amplifier waveguide to induce a population inversion in the invertible core. In another illustrative embodiment, the signal light is coupled into the amplifier waveguide, wherein the signal light is amplified as it propagates through the amplifier waveguide and exits the amplifier waveguide as amplified signal light.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1B is a side cross-section view of a P-SWA illustrating a distribution of pump light in an amplifier waveguide in accordance with one or more embodiments of the present disclosure.

DETAILED DESCRIPTION

Figure 1A:
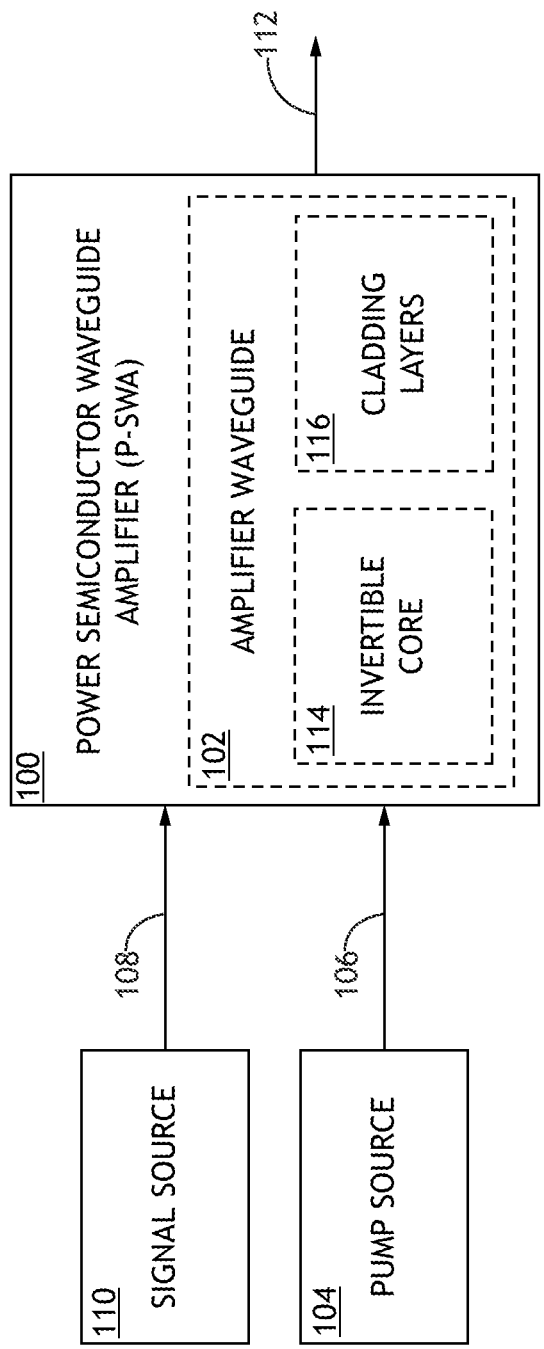
FIG. 1A is a block diagram of a power semiconductor waveguide amplifier (P-SWA) in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to power semiconductor waveguide amplifiers (P-SWAs) suitable for high power optical amplification. A P-SWA may include an optically-pumped multilayer semiconductor waveguiding heterostructure with an invertible core suitable for sustaining high-density carrier populations and providing a sufficiently long carrier lifetime for high power operation. For example, an invertible core may include any material or combination of materials having conduction and valence bands suitable for producing a population inversion of carriers upon absorption of pump light such as, but not limited to, quantum well structures or bulk semiconductor structures configured to produce optical gain when inverted. In this regard, pump light from the pump sources may be coupled into the P-SWA to induce a population inversion suitable for providing optical gain and signal light propagating through the P-SWA waveguide may be amplified. Further, the pump sources may be, but are not required to be, monolithically integrated with the P-SWA on a single chip to provide a highly efficient and compact package.

A P-SWA as disclosed herein may generally be included in a broad class of devices commonly referred to as semiconductor optical amplifiers (SOAs). For example, a P-SWA as disclosed herein may be formed from similar materials as typical SOA devices and may further be fabricated using similar techniques. As a result, a P-SWA may benefit from many of the advantages of this class of devices such as high-bandwidth amplification and compact form factors with easy integration with photonic integrated circuits (PICs).

However, it is contemplated herein that a P-SWA as disclosed herein may have various substantial structural and functional differences relative to typical SOA devices that may differentiate it from existing technologies.

In some embodiments, a P-SWA combines an amplifier waveguide suitable for propagating both pump and signal light with high confinement factors for high pumping efficiency and excellent mode overlap, undoped semiconductor materials to avoid internal losses associated with free-carrier absorption, and optical pumping to achieve higher carrier population densities, higher gain, and lower noise than currently available SOA devices or technologies.

The noise figure of an optical amplifier is directly related to the population inversion factor of the gain medium. In a traditional electrically-pumped SOA, the population inversion factor is related to the ratio of the occupancy of electrons in the conduction band to that of the holes in the valence band, where the electron-hole populations in the active gain medium are directly proportional to the injection current. However, the respective doping levels of the p- and n-layers that form the double heterostructure p-i-n device may provide a practical limit to the achievable population inversion and thus the optical gain and noise figure. For example, it may be relatively straightforward to achieve a high population inversion by simply forward biasing the p-i-n junction to lower the barriers for both electrons and holes at the opposite interfaces of the intrinsic active gain medium. The electrons and holes that recombine in the gain medium are replenished by the electrical current from the power supply. However, after a flat band situation has been achieved, the optical gain saturates since carriers cannot be electrically injected beyond the levels provided by the respective doped regions.

It is contemplated herein that inducing a population inversion in a semiconductor waveguiding structure with an invertible core through optical pumping, rather than through an electrical injection current, may overcome the limitations of doping levels on the achievable population inversion. For example, the density of available states in the conduction band and the density of electrons in the valence band can be higher than $10^{20}$ cm$^{-3}$ in some material systems, but doping levels in the cladding layers of typical SOA devices are presently limited to around $4 \times 10^{18}$ cm$^{-3}$, which limits the carrier concentrations to similar values. Direct carrier generation through optical pumping may achieve population inversions much closer to the theoretical limit in any given material system and may thus provide increased optical gain and noise figure performance.

It is further contemplated herein that a P-SWA may additionally enable greater flexibility to design an amplifier structure suitable for power optical amplification than is possible with traditional electrically pumped waveguiding SOAs. Since a typical electrically-pumped waveguiding SOA is a doped p-i-n device, it is generally desirable to have a relatively thin "i" region to achieve good electrical performance. However, this "i" region typically serves as the core of a waveguiding structure such that a requirement of a thin "i" region imposes several practical limitations on this type of structure for use as an optical amplifier. Considering a SOA device using quantum wells in the "i" region as an example, requirements for a thin "i" region limits the number of quantum wells to less than about 5 and further limits the optical mode area of the waveguiding structure. As a result, the overall optical power performance of the device is limited. Further, the optical mode area of such typical SOA devices is in practice substantially smaller than an optical mode area of optical fibers commonly used to couple light into and out of the device, which may lead to inefficient coupling or limited beam sizes.

In contrast, a P-SWA as disclosed herein is not limited by such electrical requirements and may be fabricated with undoped materials in any or all of the constituent layers. A P-SWA may thus be designed to provide an optical mode area of any desired size such as, but not limited to, matched to external optical fibers or passive waveguides in a PIC device. In this way, efficient coupling into and out of a P-SWA may be achieved. A P-SWA may further be fabricated with any number of quantum wells or fill factor of the quantum wells in the invertible core. In this way, the number and design of quantum wells in an invertible core of a P-SWA may be governed by key optical considerations such as providing a desired optical mode area and/or providing high overlap between the locations of the quantum wells and the pump/signal light to provide efficient amplification. In one embodiment, a P-SWA includes an invertible core with a 40% fill factor of quantum wells to achieve high modal gain and a corresponding reduction in the required device length. As a non-limiting example, a P-SWA with a length of 20 microns may provide an overall optical gain greater than 20 dB and a noise figure of less than 4 dB when pumped 250 mW of pump power in a bi-directional pumping scheme.

In addition, optical pumping of a P-SWA may facilitate increased control over the distribution of carriers throughout the core. For example, pumping a MQW structure through an injection current may result in an uneven distribution of carriers in the various quantum wells as a function of depth since the quantum wells are distributed in series. In contrast, optically pumping a P-SWA may facilitate an even or other selected distribution of carriers throughout the invertible core. For example, the carrier populations associated with an induced population inversion in each of the quantum wells of the MQW structure may be constant (e.g., within a selected tolerance).

It is further contemplated herein that a P-SWA may be pumped using a wide range of pumping schemes to control the optical gain, noise characteristics along the device, and/or the carrier populations. In some embodiments, a P-SWA is fabricated as a standalone device that may accept pump light, as well as signal light, through fiber optic or free-space coupling techniques. For example, signal light and pump light may be combined by a wavelength division multiplexer (WDM) to provide simultaneous coupling of the signal and pump light. In some embodiments, a P-SWA and one or more pump sources are fabricated as a monolithic package (e.g., on a common chip). In this way, efficient coupling and a compact package may be achieved. For example, the P-SWA may be fabricated on top of a pump source (e.g., a laser diode) such that the pump light may be outcoupled to the P-SWA through evanescent or directional coupling. By way of another example, pump light from an integrated pump source may be coupled to the P-SWA using tapered waveguides adjacent to an amplifier waveguide in the P-SWA.

Accordingly, it is contemplated herein that a P-SWA may provide superior performance in a more compact and flexible package than current amplifier technologies such as, but not limited to, electrically-pumped SOAs or fiber-based optical amplifiers (e.g., EDFAs).

In some embodiments, an invertible core of a P-SWA is formed using one or more homogenous planar material layers (e.g., quantum well layers and/or bulk semiconductor layers). In this way, a P-SWA may exhibit a carrier lifetime tailored to provide high energy storage and stable optical gain suitable for power amplification. It is recognized herein that the carrier lifetime plays a critical role in the performance characteristics of an optical amplifier. For example, increasing the carrier lifetime may generally increase the energy storage and gain stability for power amplification. However, in optical communication applications, the carrier lifetime should generally not be on the same order as the symbol rate of the signal to be amplified in order to avoid modification of the modulated signal.

It is contemplated herein that the carrier lifetime in an invertible core of a P-SWA may be influenced at least in part by the physical geometry of the invertible core. For example, quantum dots providing three-dimensional quantum confinement may generally provide shorter carrier lifetimes than quantum well structures providing one-dimensional quantum confinement or bulk semiconductor layers without quantum confinement. Further, the carrier lifetime of quantum dots is on the same order as the symbol rate of high-speed optical communication systems. Accordingly, planar structures may generally be better suited for an invertible core of a P-SWA.

However, it is further contemplated herein that an invertible core of a P-SWA formed from one or more homogenous planar material layers may not be limited to low-frequency or continuous-wave applications, but may also be well-suited for modulation frequencies of around 50 Gb/s or higher. In this case, the modulation frequency may be sufficiently high that the carrier population in excited states is unaffected (or minimally affected) by the modulation of the signal light.

Additional embodiments of the present disclosure are directed to a multi-stage P-SWA. For example, a P-SWA may include an invertible core amplifier waveguide and one or more pump sources distributed along the amplifier waveguide as pump stages. In this way, the signal light may be continuously amplified in a controlled manner along the amplifier waveguide. Further, the amplifier waveguide may be, but is not required to be, adiabatically tapered to increase in size along the propagation direction of the signal light.

Additional embodiments of the present disclosure are directed to an amplified laser source including a signal laser and one or more P-SWAs to provide amplification of signal laser light. In some embodiments, a laser source may include a signal laser (e.g., a seed laser) to provide signal laser light and one or more P-SWAs in a master oscillator power amplifier (MOPA) architecture.

Referring now to FIGS. 1A-9B, systems and methods for optical amplification with a P-SWA are described in greater detail in accordance with one or more embodiments of the present disclosure.

FIG. 1A is a block diagram view of a P-SWA 100 in accordance with one or more embodiments of the present disclosure.

In one embodiment, a P-SWA 100 includes an amplifier waveguide 102 and at least one pump source 104, where pump light 106 from the pump source 104 is coupled into the amplifier waveguide 102 to induce a population inversion in the amplifier waveguide 102. Accordingly, signal light 108 from a signal source 110 may also be coupled into the amplifier waveguide 102 and amplified as it propagates through the amplifier waveguide 102 and may exit the P-SWA 100 as amplified signal light 112.

FIG. 1B is a side cross-section view of a P-SWA 100 illustrating a distribution of pump light 106 in an amplifier waveguide 102 in accordance with one or more embodiments of the present disclosure.

In one embodiment, an amplifier waveguide 102 includes an invertible core 114 and one or more cladding layers 116 fabricated on a substrate 118. The amplifier waveguide 102 may have any suitable layout for propagation of both the pump light 106 and the signal light 108. For example, as illustrated in FIG. 1B, the amplifier waveguide 102 may include a strip waveguide with exposed sides 120 to increase confinement along the lateral direction (e.g., the X direction in FIG. 1B). By way of another example, the invertible core 114 may be surrounded by cladding layers 116 on any number of sides.

In some embodiments, the invertible core 114 of the amplifier waveguide 102 is formed from one or more homogeneous material layers. It is contemplated herein that an invertible core 114 formed from one or more homogeneous material layers may facilitate high optical gain, low loss, and carrier lifetimes suitable for power amplification.

In one embodiment, as illustrated in FIG. 1B, the invertible core 114 includes a quantum well core. In this regard, the invertible core 114 may include one or more quantum wells 122, where a quantum well 122 includes a thin semiconductor layer providing quantum confinement of carriers along a thickness direction (e.g., a Z direction in FIG. 1B) such that the carriers are limited to discrete energy levels. In this way, the quantum wells 122 may serve as the optical gain medium such that the pump light 106 may excite the carriers within the quantum wells 122 and the signal light 108 in the amplifier waveguide 102 may be amplified through stimulated emission.

The invertible core 114 may generally include any number or distribution of quantum wells 122. In one embodiment, the invertible core 114 is a single quantum well (SGW) structure including a single quantum well 122 (SGW). In another embodiment, the invertible core 114 is a multiple quantum well (MGW) structure including quantum wells 122 separated by one or more barrier layers 124. For example, FIG. 1B illustrates an invertible core 114 having 7 quantum wells 122 and alternating barrier layers 124. As described previously herein, the use of optical rather than electrical pumping provides substantial flexibility to select the thickness of the invertible core 114 and accordingly the number of quantum wells 122 in the invertible core 114. For example, the amplifier waveguide 102 may be fabricated with a fill factor of quantum wells 122 of 40% or greater. In a general sense, increasing the number of quantum wells 122 in a MQW invertible core 114 may increase a total population of excited carriers in a pumped state and thus increase the power tolerance of the P-SWA 100.

In another embodiment, the invertible core 114 includes a bulk layer of semiconductor material (e.g., a layer having a thickness sufficiently large that quantum confinement does not occur for wavelengths of interest). For example, the invertible core 114 and the surrounding cladding layers 116 may be selected such that the invertible core 114 layer may include a semiconductor material having conduction and valence bands suitable for supporting a population inversion upon absorption of the pump light 106 such that the signal light 108 may be amplified upon propagation through the amplifier waveguide 102. Electrically-pumped SOAs without quantum confinement in the waveguiding structure are described generally in K. Morito, M. Ekawa, T. Watanabe and Y. Kotaki, "High-output-power polarization-insensitive semiconductor optical amplifier," in Journal of Lightwave Technology, vol. 21, no. 1, pp. 176-181, January 2003, which is incorporated herein by reference in its entirety. However, it is contemplated herein that an optically-pumped P-SWA 100 formed using undoped semiconductor materials may achieve superior performance than electrically-pumped SOAs formed using doped semiconductor materials. For example, as described in greater detail below, the use of undoped semiconductor materials may reduce internal loss associated with free-carrier absorption.

In a general sense, the propagation characteristics of light in the amplifier waveguide 102 such as the mode area and the confinement factor may be controlled based on physical parameters such as, but not limited to the thicknesses and refractive indices of the invertible core 114 and the cladding layers 116, noting that the refractive index of a MQW invertible core 114 may be associated with an effective index of the constituent quantum wells 122 and barrier layers 124. Accordingly, the selection of materials and thicknesses of the cladding layers 116 and/or the invertible core 114, along with any constituent layers, may be selected to overlap the optical mode area of the pump light 106 with the invertible core 114 to provide efficient pumping of the invertible core 114 and to generate a low noise figure for the P-SWA 100. For example, as illustrated in FIG. 1B for the case of a MQW invertible core 114, the amplifier waveguide 102 is configured to provide high confinement of the pump light 106 within the amplifier waveguide 102. Further, the total thickness of the invertible core 114 and the number and thicknesses of the quantum wells 122 and barrier layers 124 are selected to provide a high degree of overlap between the quantum wells 122 and the pump light 106. In particular, the inset 126 in FIG. 1B illustrates an intensity profile of the pump light 106 along the Z direction and demonstrates excellent overlap of quantum wells 122 with the region of highest intensity.

Although not shown, the amplifier waveguide 102 may further be designed to provide a high degree of overlap of the signal light 108 with the invertible core 114 to provide efficient amplification of the signal light 108.

Additionally, the amplifier waveguide 102 may be designed to match (e.g., within a selected tolerance) the optical mode area of the pump light 106 and/or the signal light 108 to desired specifications to facilitate coupling into or out of the P-SWA 100. As described previously herein, a P-SWA implementing optical pumping rather than electrical pumping enables the flexibility to select the sizes of the cladding layers 116 and the invertible core 114 to provide any desirable optical mode size in the P-SWA 100. For example, the optical mode area of the pump light 106 and/or the signal light 108 may be selected to provide efficient coupling with optical fibers, passive PIC waveguides, or free-space optics. By way of another example, the amplifier waveguide 102 may be, but is not required to be, tapered to provide a varying optical mode size along a direction of propagation. By way of another example, the optical mode size may be selected based on power requirement specifications. In a general sense, increasing the optical mode size may facilitate increased power handling capacity by reducing the local intensity associated with a given optical power.

The amplifier waveguide 102 may generally be formed by any combination of materials suitable for providing an invertible core 114 and cladding layers 116. Further, the materials of the invertible core 114 and the cladding layers 116 may be selected to provide for amplification of signal light 108 having any wavelength or spectrum including, but not limited to, visible or IR wavelengths (e.g., near-IR, mid-IR, far-IR, or the like). In one embodiment, an invertible core 114 includes one or more quantum wells 122 formed from InGaAs and one or more barrier layers 124 formed from InGaAsP, which may be suitable for, but is not limited to, near-IR telecommunications wavelengths. In another embodiment, the cladding layers 116 are formed from InP. In another embodiment, the quantum wells 122 are formed from InGaAsP or InGaAlAs with the barrier layers 124 formed from the same quaternary semiconductors, respectively, with different compositions of the atomic constituents. While these structures are generally grown on InP substrates, alternative structures that can also be grown epitaxially on GaAs substrates include quantum wells 122 formed from strained layer InGaAs with the barrier layers 124 formed from GaAs or the quantum wells 122 can be formed from GaAs with the barrier layers 124 formed from AlGaAs. In another embodiment, structures can be grown epitaxially on GaN substrates that include quantum wells 122 formed from GaN with the barrier layers 124 formed from InGaN and cladding layers 116 formed from AlGaN. For example, this configuration may be suitable for, but is not limited to, blue light applications.

Further, the P-SWA 100, or any portion thereof, may be formed from undoped semiconductor materials. As described in greater detail below, the use of undoped semiconductor materials may reduce internal optical losses associated with free carrier absorption. In one embodiment, the cladding layers 116 are formed from undoped semiconductor materials. In another embodiment, the entire P-SWA 100 is formed from undoped semiconductor materials.

Referring again to FIG. 1A, source requirements for a P-SWA 100 are described in greater detail in accordance with one or more embodiments of the present disclosure.

A P-SWA 100 may be pumped by any suitable pump source 104 known in the art providing wavelengths of pump light 106 suitable for inducing a population inversion in the invertible core 114. For example, the pump light 106 may include one or more wavelengths associated with an absorption band of a quantum well 122 or the invertible core 114 generally. In one embodiment, a pump source 104 includes a laser source to provide coherent pump light 106. For example, a pump source 104 may include, but is not limited to, a laser diode, a fiber laser, or a solid-state laser. Further, as will be described in greater detail below, a pump source 104 may be monolithically integrated with the P-SWA 100 to provide a compact package with efficient coupling of the pump light 106 into the amplifier waveguide 102. In another embodiment, a pump source 104 includes an incoherent light source such as, but not limited to a light-emitting diode. Additionally, the pump light 106 generated by the pump source 104 may include any wavelength or range of wavelengths suitable for inducing a population inversion in the invertible core 114.

A P-SWA 100 may accept signal light 108 from any type of signal source 110 known in the art. Further, P-SWA 100 may generally be configured to provide optical amplification for any of a variety of wavelengths or ranges of wavelengths. Continuing the example above, a P-SWA 100 formed from InP cladding layers 116, InGaAs quantum wells 122 and InGaAsP barrier layers 124 may be suitable for optical amplification at around 1550 nm and pumping at wavelengths such as 980 nm or 1450 nm. By way of another example, a P-SWA 100 formed from AlGaAs cladding layers 116, strained layer InGaAs quantum wells 122, and GaAs barrier layers 124 may be suitable for optical amplification at around 980 nm and pumping at wavelengths such as 850 nm. By way of another example, a P-SWA 100 formed from AlGaAs cladding layers 116, GaAs quantum wells 122 and AlGaAs barrier layers 124 may be suitable for optical amplification at around 850 nm and pumping at wavelengths such as 808 nm. By way of a further example, a P-SWA 100 formed from AlGaN cladding layers 116, GaN quantum wells 122 and InGaN barrier layers 124 may be suitable for optical amplification at around 450 nm and pumping at wavelengths such as <400 nm.

The pump source 104 and/or the signal source 110 may generally be provided as separate components or integrated with the P-SWA 100 as an integrated system. Further, the pump light 106 and/or the signal light 108 may be coupled into the P-SWA 100 using any technique known in the art including, but not limited to, end-coupling (e.g., direct coupling) or evanescent coupling.

Figure 1C:
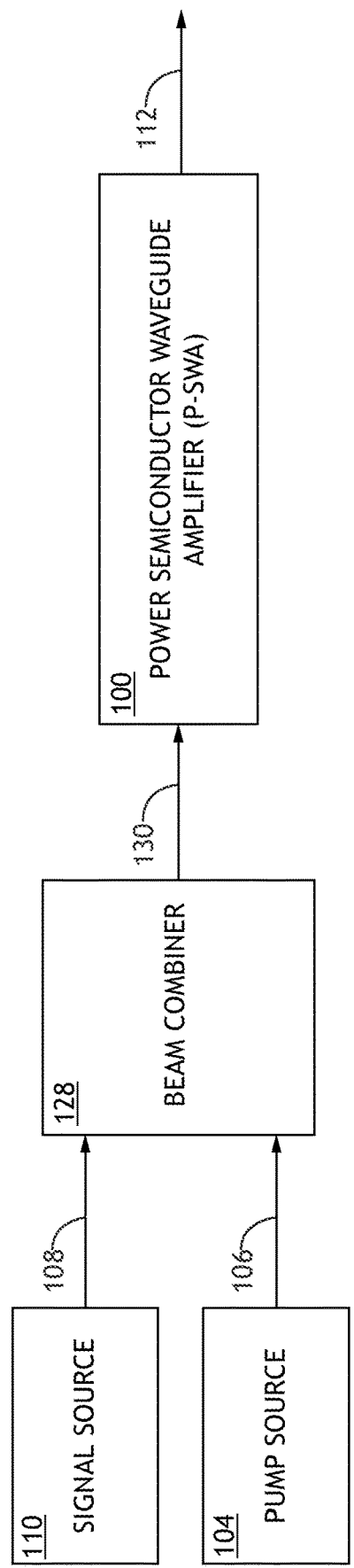
FIG. 1C is a block diagram illustrating direct coupling of the pump light and signal light from external sources into a common face of the P-SWA in accordance with one or more embodiments of the present disclosure.

FIG. 1C is a block diagram illustrating direct coupling of the pump light 106 and signal light 108 from external sources into a common face of the P-SWA 100 in accordance with one or more embodiments of the present disclosure. In one embodiment, signal light 108 from a signal source 110 and pump light 106 from a pump source 104 are combined in a beam combiner 128 such as, but not limited to a wavelength division multiplexer, to propagate along a common optical path 130. In this way, both the signal light 108 and the pump light 106 may be directly coupled into the P-SWA 100. Further, the beam combiner 128 may be based on free-space optics, fiber-based, or waveguide-based (potentially on a common chip as the P-SWA 100). Accordingly, a P-SWA 100 as configured in FIG. 1C may provide a direct replacement for existing fiber-based amplifiers such as EDFAs.

Additional embodiments illustrating the integration of the pump source 104 and/or the signal source 110 with the P-SWA 100 are illustrated in FIGS. 7B-9B. In this regard, an integrated system may be, but is not required to be, generally referred to as a P-SWA 100 or a system including a P-SWA 100. Accordingly, it is to be understood that FIG. 1A is provided solely for illustrative purposes and should not be interpreted as limiting.

Referring now to FIGS. 2-6B, the performance of a P-SWA 100 is described in greater detail in accordance with one or more embodiments of the present disclosure.

The optical gain (g) of a semiconductor active medium may generally be characterized as:

$$g \propto \{DOS \times (f_c(E_2) f_v(E_1))\}, \text{ where} \tag{1}$$

-continued $$f_c(E) = \frac{1}{1+\exp\left(\frac{E-E_{fn}}{K_BT}\right)} \text{ and} \quad (2)$$

$$f_v(E) = \frac{1}{1+\exp\left(\frac{E-E_{fp}}{K_PT}\right)}. \quad (3)$$

In equations (1)-(3), DOS refers to the density of states, E is a variable representing energy, $E_{fn}$ and $E_{fp}$ are the quasi-Fermi energy levels for electrons and holes respectively, $k_B$ is the Boltzmann constant, and T is temperature. As to be expected, $E_{fn}$ increases as the electron population in the active gain medium is increased and $E_{fp}$ decreases as the hole population is increased.

In a regular double heterostructure p-i-n semiconductor SOA suitable for electrical pumping, the maximum departure of $E_{fn}$ from $E_{fp}$ is attained when flat band condition exists at both hetero-interfaces. This implies that within the active medium, the maximum injected electron concentration cannot be much higher than the doping concentration in the n-doped cladding layer and the injected hole concentration cannot be higher than the doping concentration in the p-doped cladding layer. Because semiconductors cannot be doped much higher than $4 \times 10^{18}$ cm$^{-3}$, this effectively limits the maximum gain coefficient in electrically pumped SOAs.

In contrast, a P-SWA 100 may be formed entirely from undoped materials and the gain is unrelated to doping. Instead, as long as the pump light 106 is primarily absorbed in the gain semiconductor (e.g., quantum wells 122 or an invertible bulk semiconductor material), the carrier concentration can be much higher than $10^{19}$ cm$^{-3}$ with no free carrier absorption in the cladding regions. Further, the population inversion factor ($n_{sp}$), which may be characterized as $$n_{sp} = \left(\frac{N_2}{N_2 - N_1}\right)$$

with $N_1$ representing a carrier population in a lower energy state and $N_2$ representing a carrier population in higher excited energy state, of a P-SWA 100 can be decreased considerably beyond what is achievable with electrical carrier injections.

Figure 2:
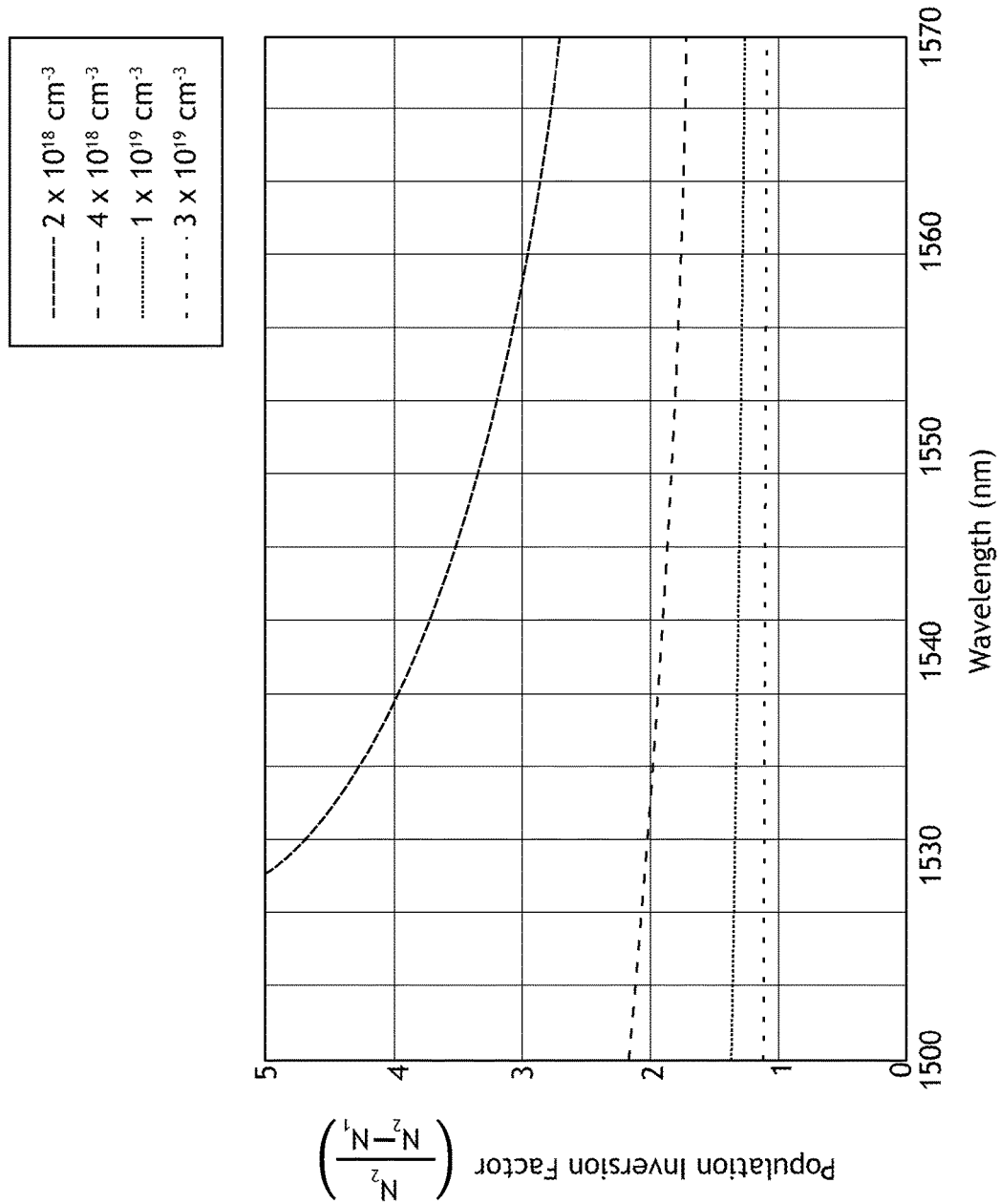
FIG. 2 is a plot illustrating a population inversion factor of a P-SWA with a InGaAs/InGaAsP invertible core for varying carrier population levels in accordance with one or more embodiments of the present disclosure.

FIG. 2 is a plot illustrating a population inversion factor of a P-SWA 100 with a InGaAs/InGaAsP invertible core 114 for varying carrier population levels in accordance with one or more embodiments of the present disclosure. For example, the varying carrier population levels in FIG. 2 may be associated with varying power of the pump light 106, varying numbers of quantum wells 122, or the like. As illustrated in FIG. 2, increasing the carrier concentration levels leads to substantial decreases in the population inversion factor $$n_{sp} = \left(\frac{N_2}{N_2 - N_1}\right)$$

for multiple wavelengths. In particular, increasing the carrier concentration levels to the order of $10^{19}$ cm$^{-3}$ (e.g., beyond the limits of electrical carrier injection which is typically around $4 \times 10^{18}$ cm$^{-3}$) results in a dramatic decrease of the population inversion factor. As a result, because optically induced excitation can easily produce carriers in excess of $10^{19}$ cm$^{-3}$, an extremely low population inversion factor can be attained.

The noise figure ($F_n$) of a semiconductor quantum well optical amplifier is given by $$F_n = 2n_{sp} \times \frac{\Gamma g}{\Gamma g - \alpha_{int}}, \quad (4)$$

where g is the gain coefficient of the amplifier waveguide 102, $\Gamma$ is the optical confinement factor of the signal light 108 in the invertible core 114 (e.g., a fraction of the power of the signal light 108 in the invertible core 114), and $\alpha_{int}$ is the internal loss. In a typical laser, the internal loss $\alpha_{int}$ is mostly due to the free carrier absorption in the cladding layers 116.

Based on equation (4), several benefits of optical pumping are evident, particularly when contrasted to electrical pumping of a p-i-n SOA. For example, in order to be able to achieve a high population inversion (needed for a small $n_{sp}$) in an electrically-pumped SOA, the cladding regions need to be doped to the maximum level allowable by the epitaxial growth process. However, doping the cladding regions leads to free carrier absorption in the cladding regions, which increases the internal loss $\alpha_{int}$ and increases the noise figure. Further, as described previously herein, electrical conditions favor a relatively thin active core, which limits the number of quantum wells and leads to small optical confinement, $\Gamma$, and a correspondingly high noise figure. These factors limit the magnitude of the ratio of gain to loss to significantly less than unity.

In contrast, a P-SWA 100 may be fabricated with undoped cladding layers 116 to limit the internal loss $\alpha_{int}$. In this case, the noise figure may be substantially reduced and may be characterized as:

$$F_n \approx 2n_{sp}. \quad (5)$$

Further, the corresponding size of the invertible core 114 (and thus the number of quantum wells 122 in a MQW invertible core 114) are not limited in a P-SWA 100. As a result, the confinement factor can be as high as $\Gamma=0.5$.

Figure 3:
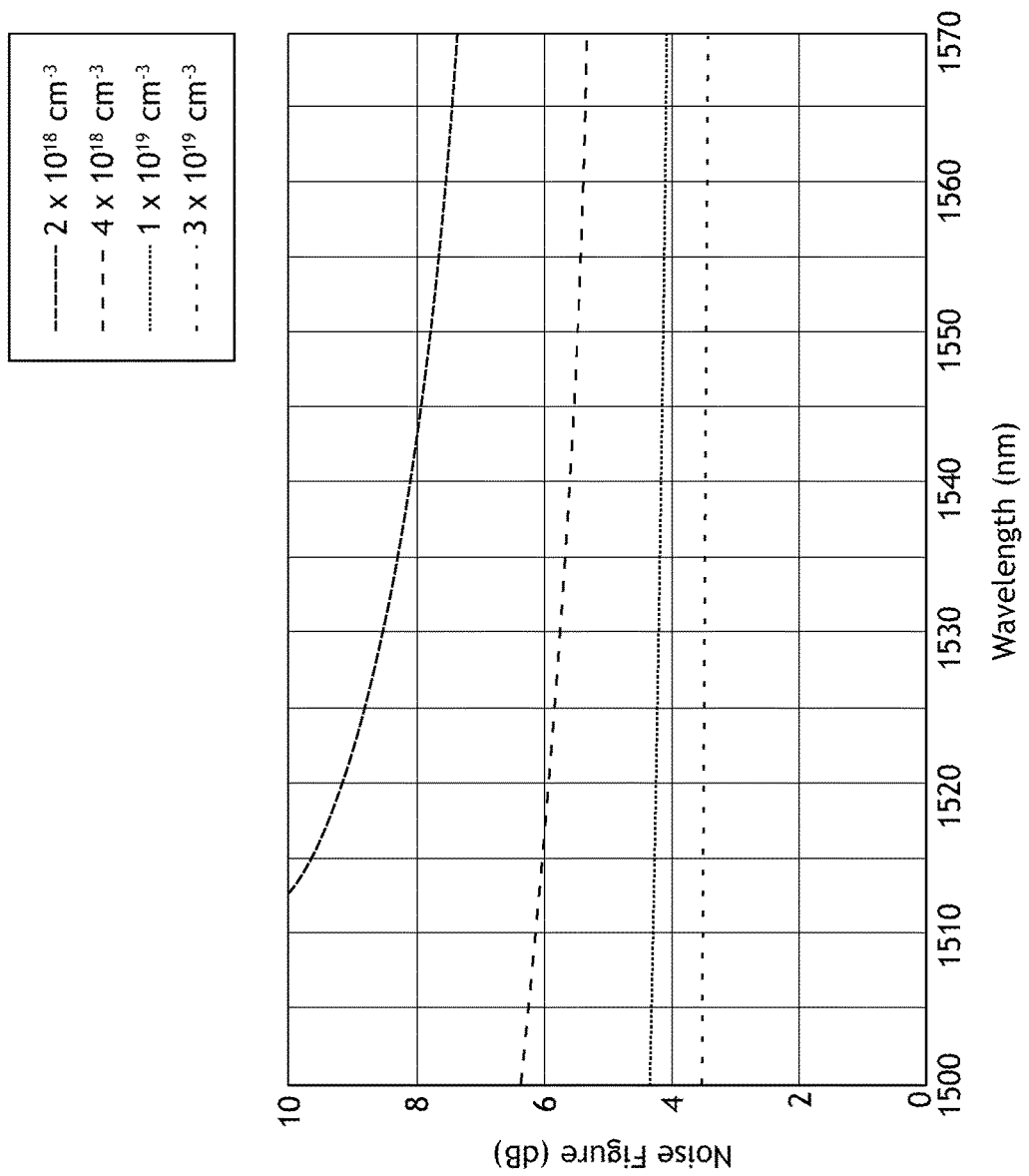
FIG. 3 is a plot of the noise figure ($F_n$) in dB as a function of wavelength for different carrier populations in accordance with one or more embodiments of the present disclosure.

FIG. 3 is a plot of the noise figure ($F_n$) in dB as a function of wavelength for different carrier populations in accordance with one or more embodiments of the present disclosure. In particular, carrier populations on the order of $10^{18}$ may be achievable with electrical injection, but carrier populations on the order of $10^{19}$ are only achievable using a P-SWA 100 based on optical pumping of an undoped semiconductor structure. In particular, a P-SWA 100 may be optically pumped to very high carrier populations of $3 \times 10^{19}$ cm$^{-3}$, which can lead to a very low noise figure of 3.3 dB.

Figure 4A:
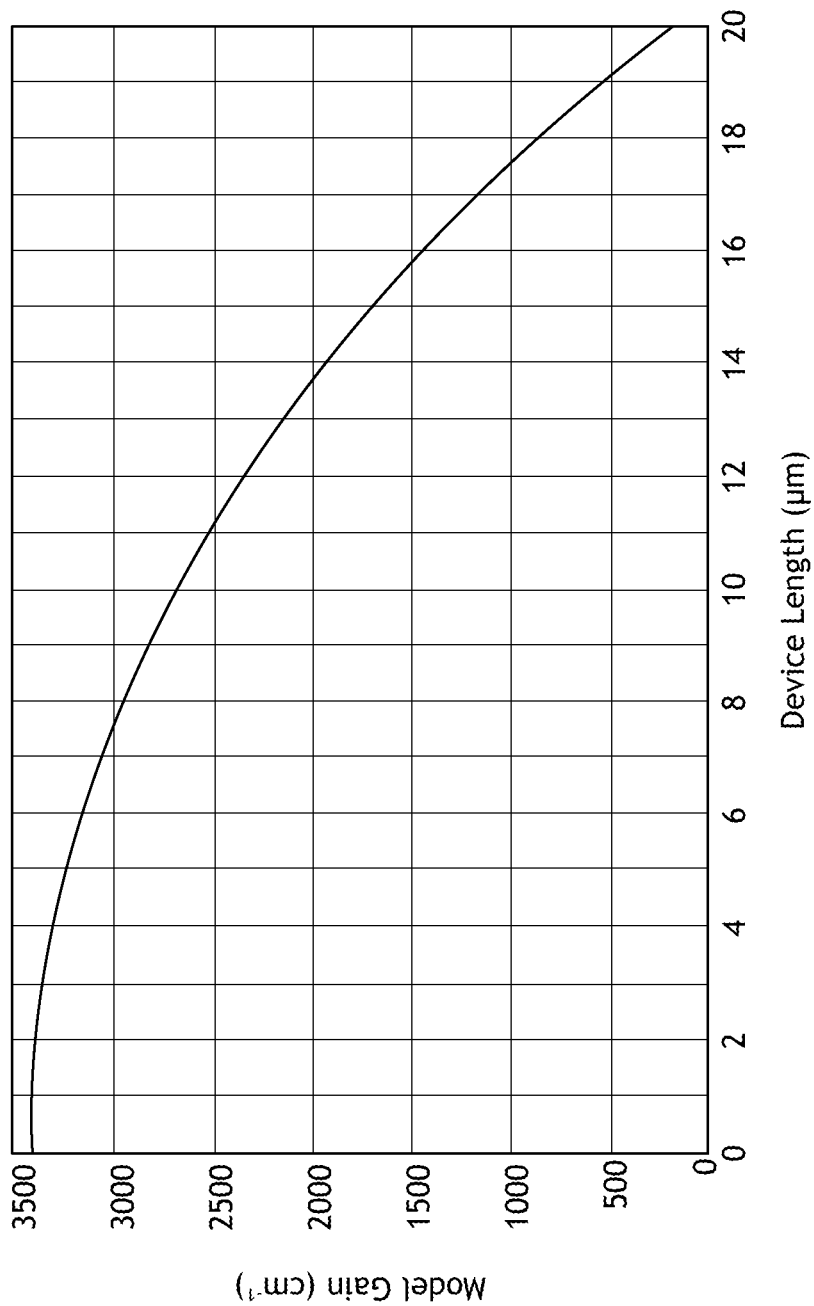
FIG. 4A is a plot illustrating modal gain from a P-SWA with 25 quantum wells and a confinement factor of Γ=0.5 in accordance with one or more embodiments of the present disclosure.
Figure 4B:
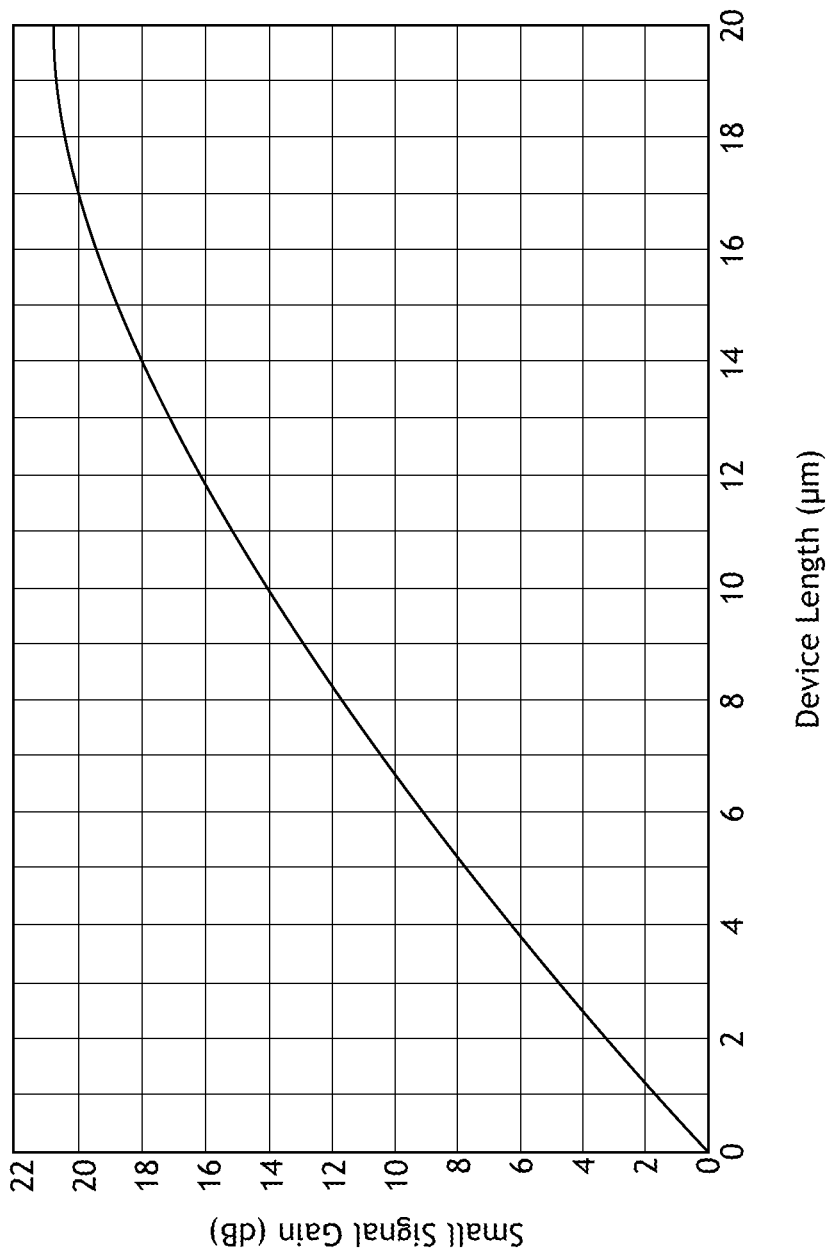
FIG. 4B is a plot illustrating small signal gain from a P-SWA with 25 quantum wells and a confinement factor of Γ=0.5 in accordance with one or more embodiments of the present disclosure.

FIGS. 4A and 4B include simulations illustrating high optical gain from a P-SWA 100 with many quantum wells 122 and a high confinement factor. FIG. 4A is a plot illustrating modal gain from a P-SWA 100 with 25 quantum wells 122 and a confinement factor of F=0.5 in accordance with one or more embodiments of the present disclosure. FIG. 4B is a plot illustrating small signal gain from a P-SWA 100 with 25 quantum wells 122 and a confinement factor of F=0.5 in accordance with one or more embodiments of the present disclosure. In FIGS. 4A and 4B, the invertible core 114 of the P-SWA 100 is formed with 25 quantum wells 122, each 9 nm thick and spaced 20 nm apart (e.g., by barrier layers 124) to give the overall modal confinement factor of F=0.5. Further, the P-SWA 100 is pumped with 80 mW with direct pumping from a single face (e.g., as illustrated in FIG.

1C). Under these conditions, the P-SWA 100 achieved a modal gain coefficient of 3400 cm$^{-1}$, leading to a signal gain of 20 dB in a device that is only 20 µm long. It is further contemplated that bidirectional distributed pumping may further provide a more uniform modal gain and a larger signal output power.

Figure 5:
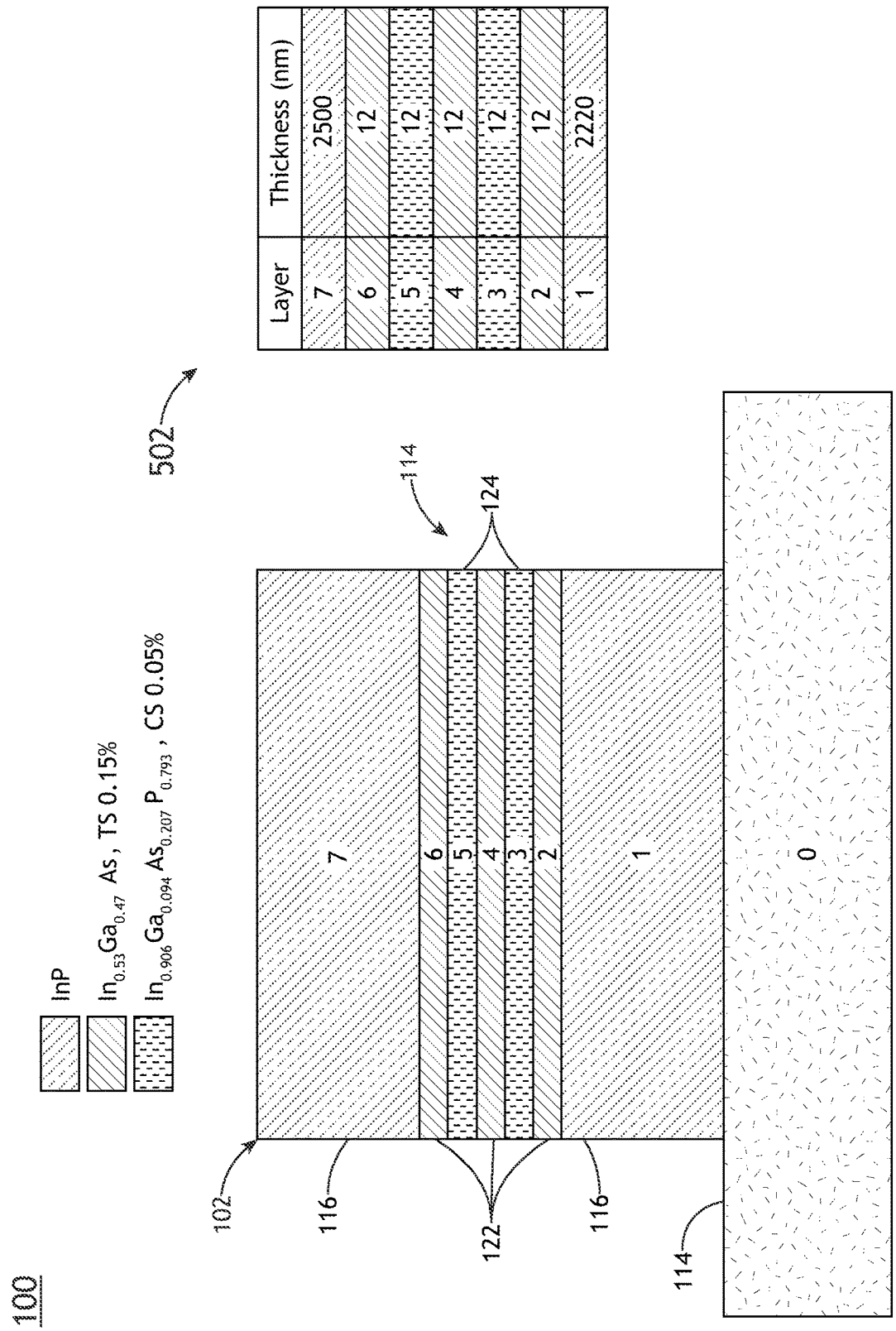
FIG. 5 is a cross-section view a P-SWA including a strained invertible core to provide equalized gain for TE and TM modes in accordance with one or more embodiments of the present disclosure.
Figure 6A:
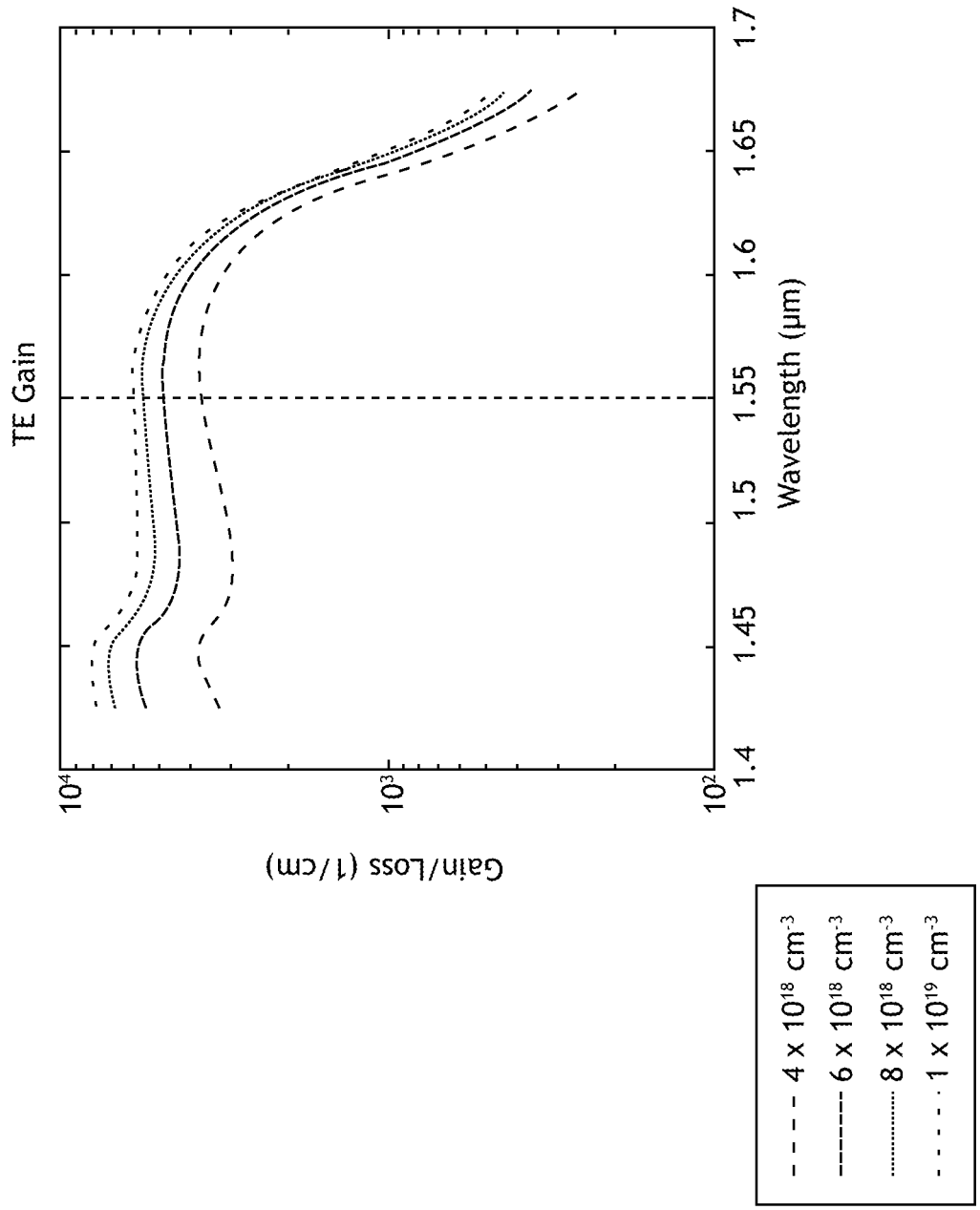
FIG. 6A is a simulated plot of the optical gain of TE-polarized signal light by the P-SWA of FIG. 5 as a function of wavelength for different carrier densities in accordance with one or more embodiments of the present disclosure.
Figure 6B:
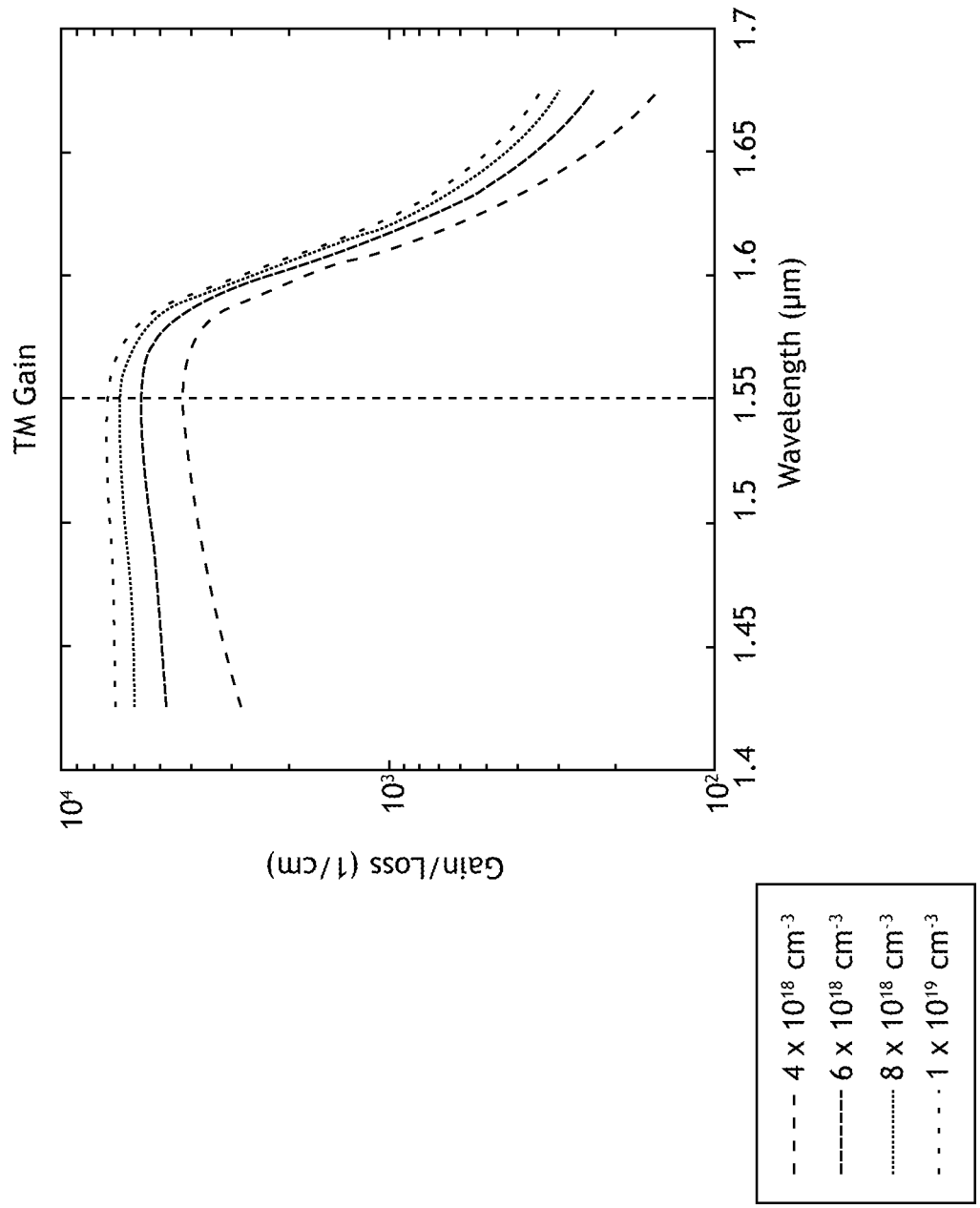
FIG. 6B is a simulated plot of the optical gain of TM-polarized signal light by the P-SWA of FIG. 5 as a function of wavelength for different carrier densities in accordance with one or more embodiments of the present disclosure.

Referring now to FIGS. 5-6B, mechanisms for equalizing the optical gain for both TE and TM polarizations, at least within a selected tolerance, are described in greater detail in accordance with one or more embodiments of the present disclosure. It is recognized herein that heterostructure semiconductor optical amplifiers may preferentially amplify TE modes of signal light 108. While this may be acceptable in some applications, it may be desirable to equalize, or at least partially equalize, the gain for both TE and TM modes.

In one embodiment, equalized gain is achieved through the use of two P-SWAs 100. For example, signal light 108 to be amplified may be split into TE and TM modes (e.g., by a polarizing beamsplitter) directed along two paths. A first P-SWA 100 is placed in a first path including TE-polarized signal light 108 to amplify the TE-polarized signal light 108. In a second path, a second P-SWA 100 is placed between two polarization rotators (e.g., waveplates). In this way, the TM-polarized signal light 108 is rotated to TE-polarization for efficient amplification with the second P-SWA 100 and converted back to TM polarization. Further, the amplified signal light 112 along both paths may be combined (e.g., by another polarizing beamsplitter). In this configuration, the first and second P-SWAs 100 may be unmodified.

In another embodiment, a single P-SWA 100 may provide equalized, or at least partially equalized, gain for both TE and TM modes through the use of alternating compressively strained (CS) and tensile strained (TS) layers in the invertible core 114. FIG. 5 is a cross-section view a P-SWA 100 including a TS/CS invertible core 114 to provide equalized gain for TE and TM modes in accordance with one or more embodiments of the present disclosure. In FIG. 5, each layer of the P-SWA 100 is labeled with a layer number ranging from 1-10 and the thicknesses of the layers is provided in the inset table 502.

In particular, FIG. 5 illustrates an invertible core 114 with alternating 0.15% tensile strained In$_{0.53}$Ga$_{0.47}$As quantum wells 122 and 0.05% compressively strained In$_{0.906}$Ga$_{0.094}$As$_{0.207}$P$_{0.793}$ barrier layers 124. Further, the P-SWA 100 in FIG. 5 includes InP separate confinement heterostructure (SCH) cladding layers 116 that are not strained.

FIG. 6A is a simulated plot of the optical gain of TE-polarized signal light 108 by the P-SWA 100 of FIG. 5 as a function of wavelength for different carrier densities in accordance with one or more embodiments of the present disclosure. FIG. 6B is a simulated plot of the optical gain of TM-polarized signal light 108 by the P-SWA 100 of FIG. 5 as a function of wavelength for different carrier densities in accordance with one or more embodiments of the present disclosure.

As illustrated by FIGS. 6A and 6B, the P-SWA 100 of FIG. 5 including an invertible core 114 with alternately strained layers provides nearly uniform gain of TE and TM signal light 108 for a range of wavelengths around 1.55 µm. For the range of carrier densities shown, the gain bandwidth for each is over 100 nm. Additionally, as illustrated in FIGS. 6A and 6B, the gain flatness for TE and TM modes as well as gain equalization improves as the carrier density is increased from $4\times10^{18}$ cm$^{-3}$ to $1\times10^{19}$ cm$^{-3}$. In this way, the high carrier densities achievable with a P-SWA 100 may provide additional benefits over traditional electrically-pumped SOAs.

It is to be understood, however, that FIGS. 5-6B are provided solely for illustrative purposes and should not be interpreted as limiting. In particular, a P-SWA 100 is not limited to the specific materials, geometry, or strain values illustrated in FIG. 5. For example, in some embodiments, the quantum wells 122 are compressively strained and the barrier layers 124 are tensile strained. Additional configurations of strain profiles suitable for at least partially equalizing the TE and TM gain are also within the spirit and scope of the present disclosure.

Referring now to FIGS. 7A-9B, integrated devices including one or more P-SWAs 100 are described in greater detail in accordance with one or more embodiments of the present disclosure. It is contemplated herein that a P-SWA 100 may be monolithically integrated with a variety of components such as, but not limited to, one or more pump sources 104, a signal source 110, or passive waveguides for input/output coupling from the P-SWA 100. Further, various configurations of these or other components may be within the spirit and scope of the present disclosure.

Figure 7A:
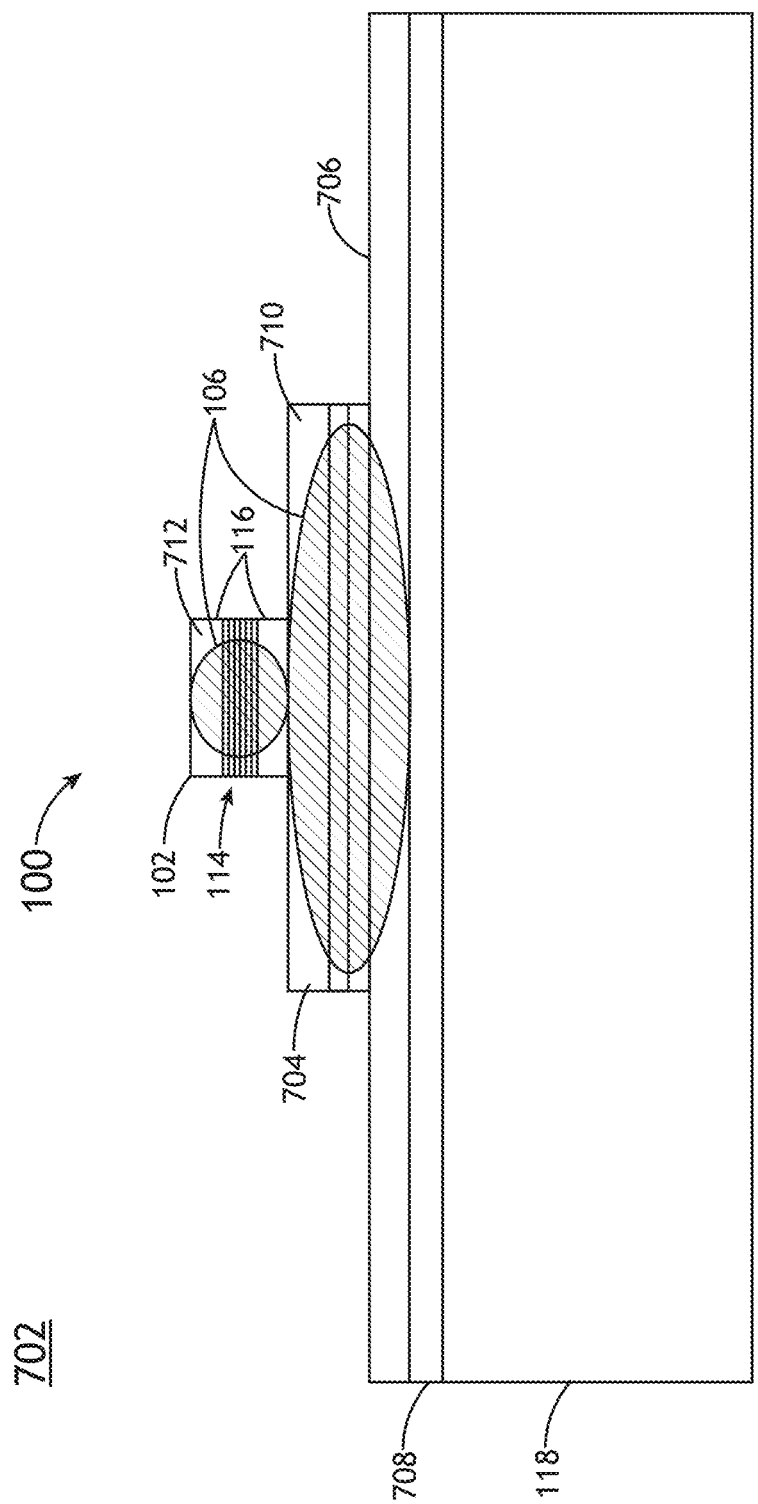
FIG. 7A is a side cross-section view of an integrated amplification system including a P-SWA integrated with a pump source in accordance with one or more embodiments of the present disclosure.

FIG. 7A is a side cross-section view of an integrated amplification system 702 including a P-SWA 100 integrated with a pump source 104 in accordance with one or more embodiments of the present disclosure. In FIG. 7A, a P-SWA 100 is fabricated directly on a pump source 104. In particular, FIG. 7A illustrates a P-SWA 100 with a MQW invertible core 114 (e.g., similar to the P-SWA 100 in FIG. 1B) fabricated directly on a p-i-n graded index separate confinement heterostructure single quantum well (GRINSCH-SQW) high power pump laser structure, where the whole integrated amplification system 702 is grown on a common substrate. For instance, the P-SWA 100 in FIG. 7A includes undoped Al$_{X1}$Ga$_{(1-X1)}$As cladding layers 116 and an undoped INGaAs MQW invertible core 114. Further, the pump source 104 in FIG. 7A includes a GRIN AlGaAs core with a GaAs quantum well invertible core surrounded by p- and n-doped doped Al$_{X2}$Ga$_{(1-X2)}$As cladding 704,706 grown on an n-doped GaAs substrate 118 with an n-doped GaAs buffer layer 708. However, it is to be understood that FIG. 7A is provided solely for illustrative purposes as an exemplary high-power package and should not be interpreted as limiting. For example, any type of P-SWA 100 such as, but not limited to, a P-SWA 100 having a SQW invertible core 114 or a bulk semiconductor layer invertible core 114 may be fabricated directly on a pump source 104. Similarly, a P-SWA 100 may be fabricated on any type of pump source 104 including, but not limited to, any laser diode structure providing pump light 106 suitable for pumping the P-SWA 100.

In one embodiment, the thicknesses of the constituent layers of the P-SWA 100 and the pump source 104 are selected to provide evanescent coupling of the pump light 106 from the pump source 104 into the P-SWA 100. For example, as illustrated in FIG. 7A, the pump light 106 is not fully confined within the pump source 104 to allow for evanescent coupling into the P-SWA 100.

In another embodiment, the pump source 104 includes high-reflection coatings for wavelengths associated with the pump light 106 on end faces 710 of the pump source 104 to promote efficient coupling of the pump light 106 to the P-SWA 100 and avoid outcoupling of the pump light 106 through the end faces 710. Similarly, the P-SWA 100 may have high-reflection coatings for wavelengths associated with the pump light 106 on end faces 712 of the P-SWA 100 to further promote efficient optical pumping of the P-SWA 100. In this case, the coatings on the end faces 712 may be antireflective, or at least partially antireflective, at wavelengths associated with the signal light 108 to provide for extraction of amplified signal light 112.

Figure 7B:
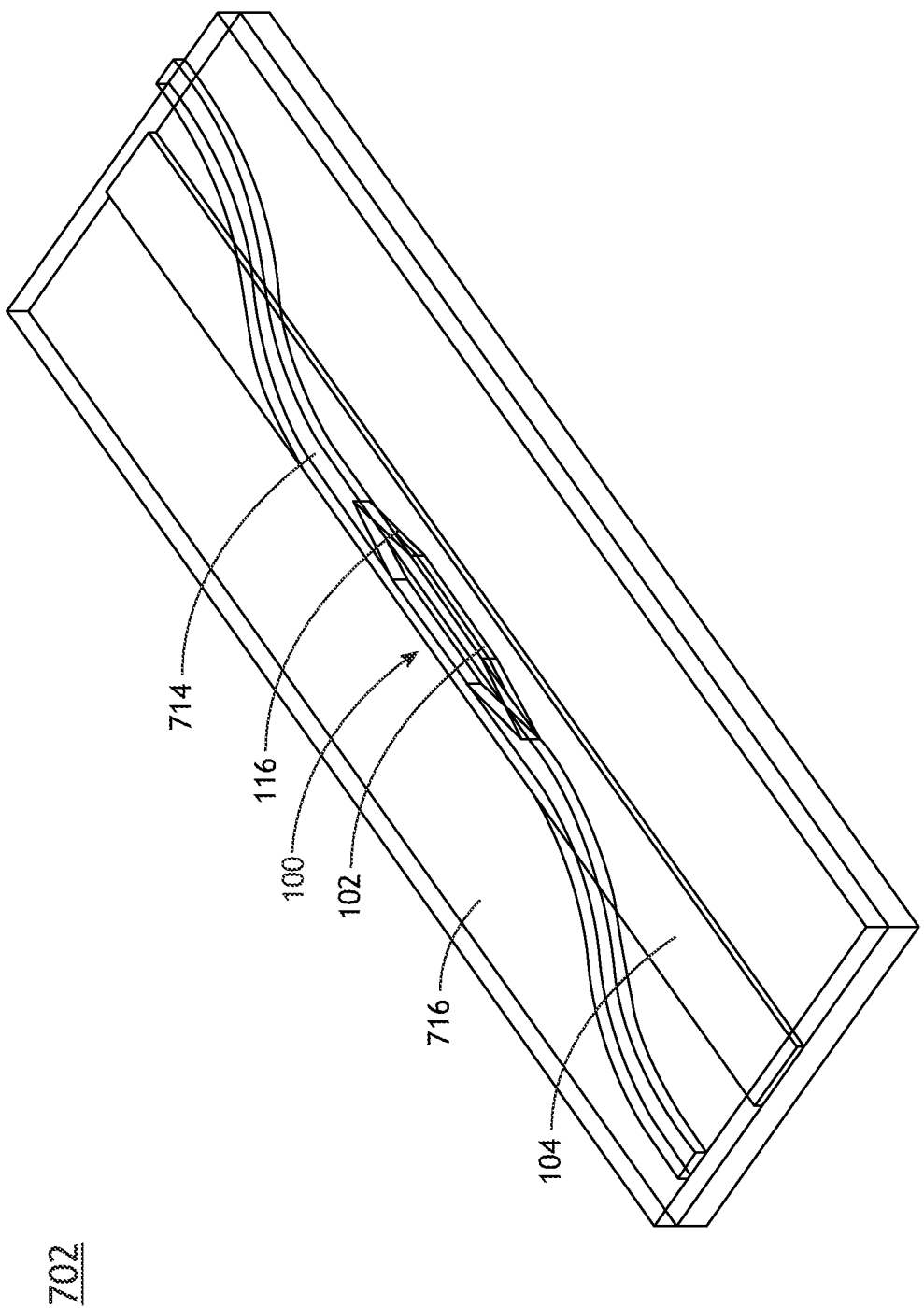
FIG. 7B is a perspective view of the integrated amplification system in which the P-SWA is further integrated with a passive waveguide in accordance with one or more embodiments of the present disclosure.

FIG. 7B is a perspective view of the integrated amplification system 702 in which the P-SWA 100 is further integrated with a passive waveguide 714 in accordance with one or more embodiments of the present disclosure. For example, the passive waveguide 714 may couple the signal light 108 into the P-SWA 100 and may further couple the amplified signal light 112 from the P-SWA 100.

A passive waveguide 714 may couple with the P-SWA 100 using any technique known in the art. In one embodiment, a passive waveguide may be fabricated to provide direct end coupling to end faces 712 of the P-SWA 100. In another embodiment, as illustrated in FIG. 7B, the integrated amplification system 702 is planarized to provide a planar top surface 716 suitable for integration with additional components of a PIC device such as, but not limited to the passive waveguide 714. For example, the integrated amplification system 702 may be planarized using any suitable material for providing the planar top surface 716 without substantially modifying the optical properties (e.g., the confinement) of the P-SWA 100 or the pump source 104 such as, but not limited to, BCB (bisbenzocyclobutane). Further, the integrated amplification system 702 may include a tapered waveguide or waveguide section to promote coupling to or from the passive waveguide 714. In particular, FIG. 7B illustrates a non-limiting configuration in which a portion of the lower cladding layer 116 of the P-SWA 100 is removed and a top cladding layer of the P-SWA 100 is laterally tapered on each end of the P-SWA 100 to provide coupling with the passive waveguide 714.

In a general sense, a P-SWA 100 may be integrated with any additional components to form or otherwise integrate with PIC devices using any fabrication techniques known in the art. In this way, FIG. 7B is intended merely as an illustration and should not be interpreted as limiting.

Figure 8A:
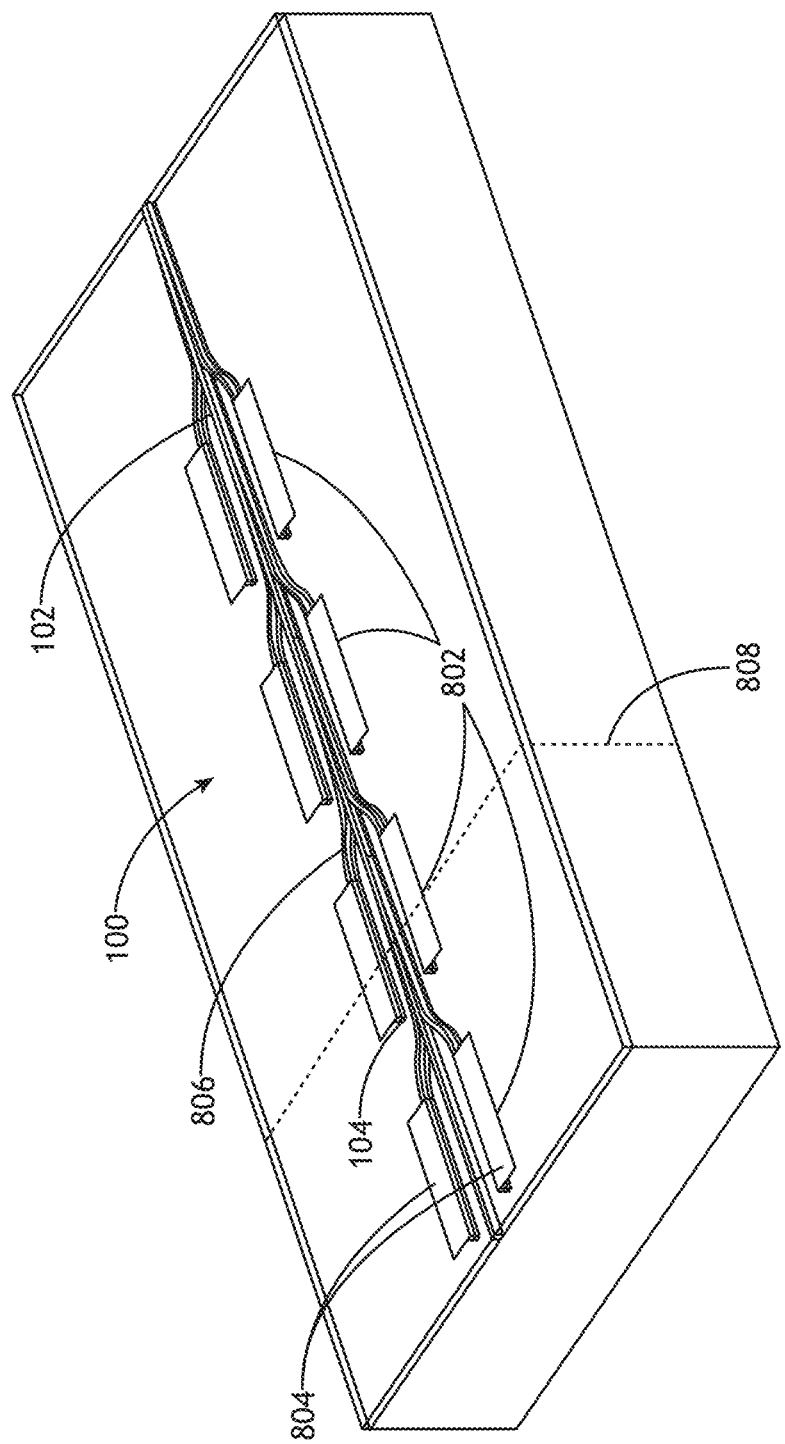
FIG. 8A is a multi-stage P-SWA in accordance with one or more embodiments of the present disclosure.

Referring now to FIGS. 8A-9, multi-stage amplification with one or more P-SWAs 100 is described in greater detail in accordance with one or more embodiments of the present disclosure. In one embodiment, a P-SWA 100 includes two or more pump sources 104 distributed along an amplifier waveguide 102 to provide two or more amplification stages of signal light 108 propagating through the amplifier waveguide 102. In this regard, the power of the signal source 110 may be increased through each amplification stage. Further, the use of multiple amplification stages may facilitate the distribution of optical gain throughout the amplifier waveguide 102. It is contemplated herein that a P-SWA 100 providing multi-stage amplification may provide high-power amplified signal light 112 in a compact form factor that is easy to integrate with additional components. For example, a P-SWA 100 providing multi-stage amplification may provide output powers of greater than 100 Watts. In some cases, the output power may be greater than a kilowatt. Further, the amplified signal light 112 may be provided in a single optical mode, a few-mode configuration, or a multi-mode configuration depending on the configuration of the amplifier waveguide 102.

FIG. 8A is a multi-stage P-SWA 100 in accordance with one or more embodiments of the present disclosure. In particular, FIG. 8A illustrates a P-SWA 100 having four amplification stages 802, where each amplification stage 802 includes two pump sources 104. FIG. 8A further illustrates electrical contacts 804 for electrically pumping the pump sources 104. In one embodiment, the P-SWA 100 includes one or more tapered waveguides 806 to couple pump light 106 into the amplifier waveguide 102. For example, FIG. 8A illustrates a configuration in which the pump sources 104 are monolithically integrated with the amplifier waveguide 102 on a common substrate and are fabricated on both sides of the amplifier waveguide 102. In this configuration, the tapered waveguides 806 in each amplification stage 802 are positioned on opposing sides of the amplifier waveguide 102 to symmetrically couple pump light 106 into the amplifier waveguide 102.

Figure 8B:
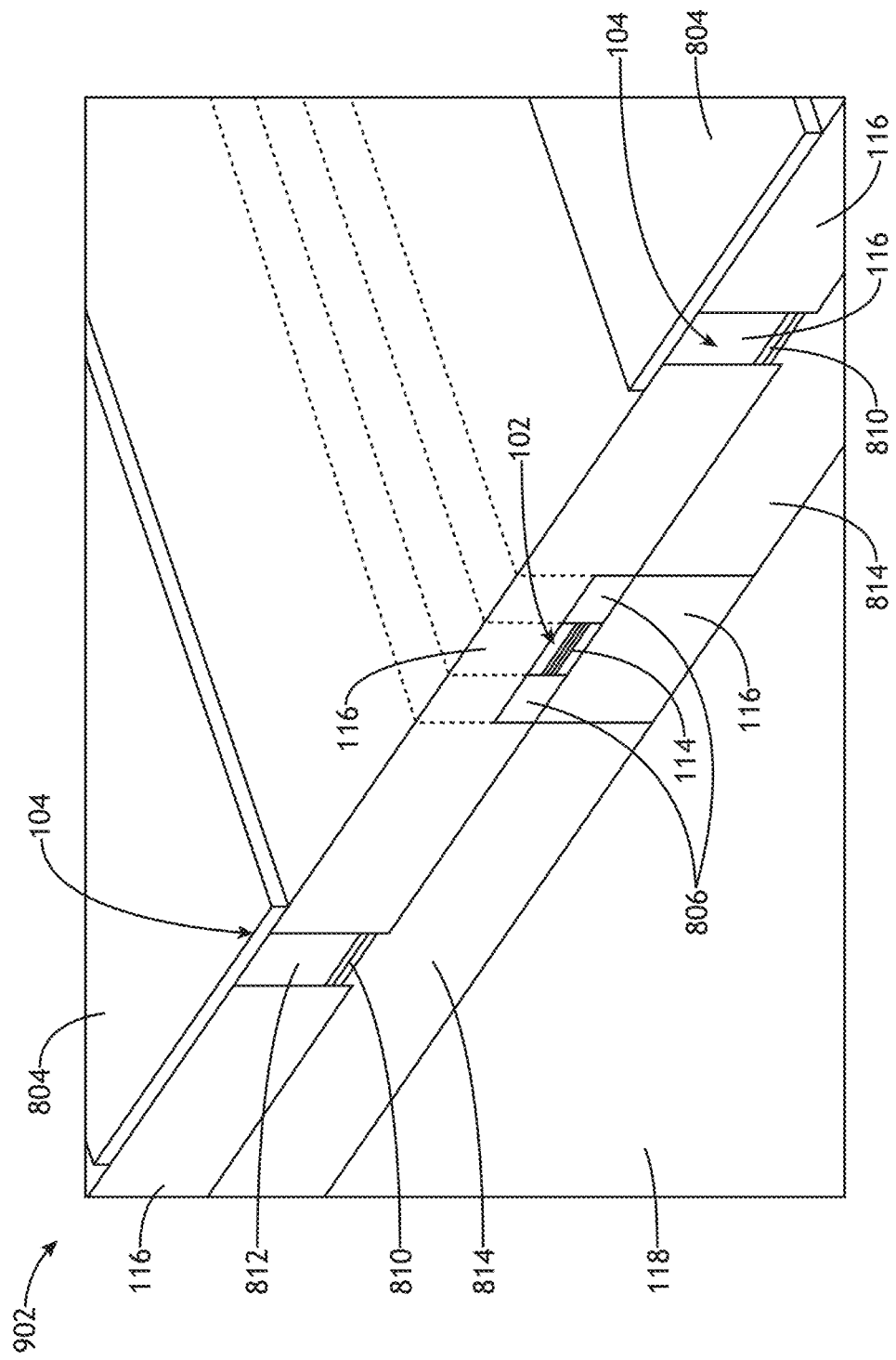
FIG. 8B is a perspective cross-section view of the P-SWA of FIG. 8A in accordance with one or more embodiments of the present disclosure.

FIG. 8B is a perspective cross-section view of the plane 808 shown in FIG. 8A in accordance with one or more embodiments of the present disclosure. In particular, FIG. 8B illustrates an amplifier waveguide 102 with a MQW invertible core 114 and cladding layers 116, where the invertible core 114 and cladding layers 116 are all undoped. Additionally, FIG. 8B illustrates the tapered waveguides 806 on either side of the amplifier waveguide 102 for coupling the pump light 106 into the amplifier waveguide 102.

FIG. 8B further illustrates pump sources 104 formed as laser diodes integrated onto a common substrate 118 and at a common height as the amplifier waveguide 102. For example, the pump sources 104 include a quantum well core 810 with surrounded by a p-doped cladding layer 812 and an n-doped cladding layer 814. In this way, the pump sources 104 may be electrically pumped using the electrical contacts 804. Further, the tapered waveguides 806 may be formed from any suitable material including, but not limited to, the material used for the core 810 but without the quantum well layers.

However, it is to be understood that FIGS. 8A and 8B are provided solely for illustrative purposes and should not be interpreted as limiting. Rather, it is contemplated herein that a multi-stage P-SWA 100 may include any number of amplification stages 802 and any number of pump sources 104 associated with any particular amplification stage 802. Further, pump light 106 from any pump source 104 may be coupled to the amplifier waveguide 102 using any technique known in the art including, but not limited to, direct coupling (e.g., end coupling) or evanescent coupling.

Figure 8C:
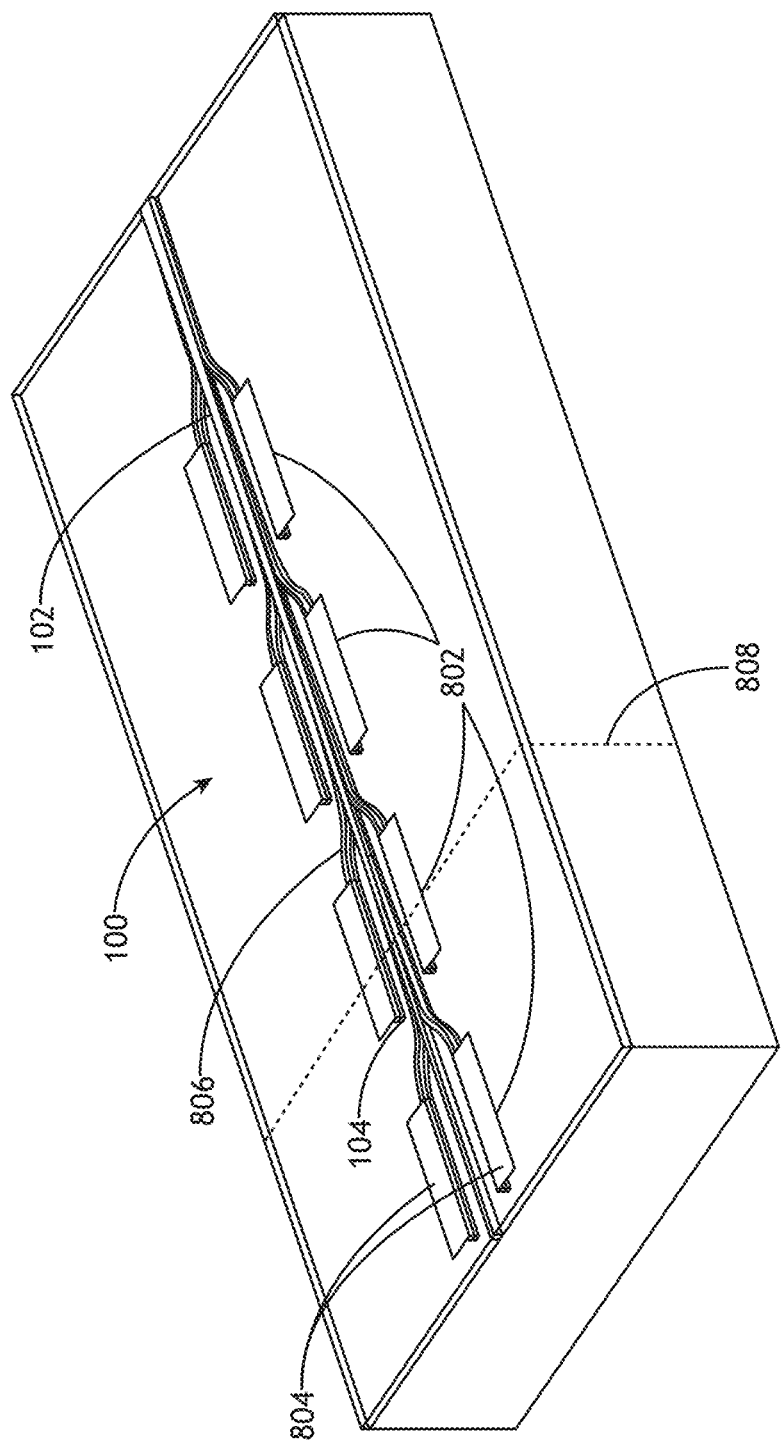
FIG. 8C is a is a multi-stage P-SWA including an amplifier waveguide with an adiabatically increasing width in accordance with one or more embodiments of the present disclosure.

In another embodiment, one or more dimensions of the amplifier waveguide 102 increase along a propagation direction of the signal light 108 to facilitate power management in the P-SWA 100. For example, increasing the size of the amplifier waveguide 102 may increase the optical mode area and decrease the intensity of the signal light 108, which may mitigate thermal effects and avoid damage to end facets or other material transitions. FIG. 8C is a is a multi-stage P-SWA 100 including an amplifier waveguide 102 with an adiabatically increasing width in accordance with one or more embodiments of the present disclosure. The P-SWA 100 in FIG. 8C is substantially similar to the P-SWA 100 in FIGS. 8A and 8B except for the dimensions of the amplifier waveguide 102. In this way, the description of FIGS. 8A and 8B also generally applies to FIG. 8C.

Figure 9A:
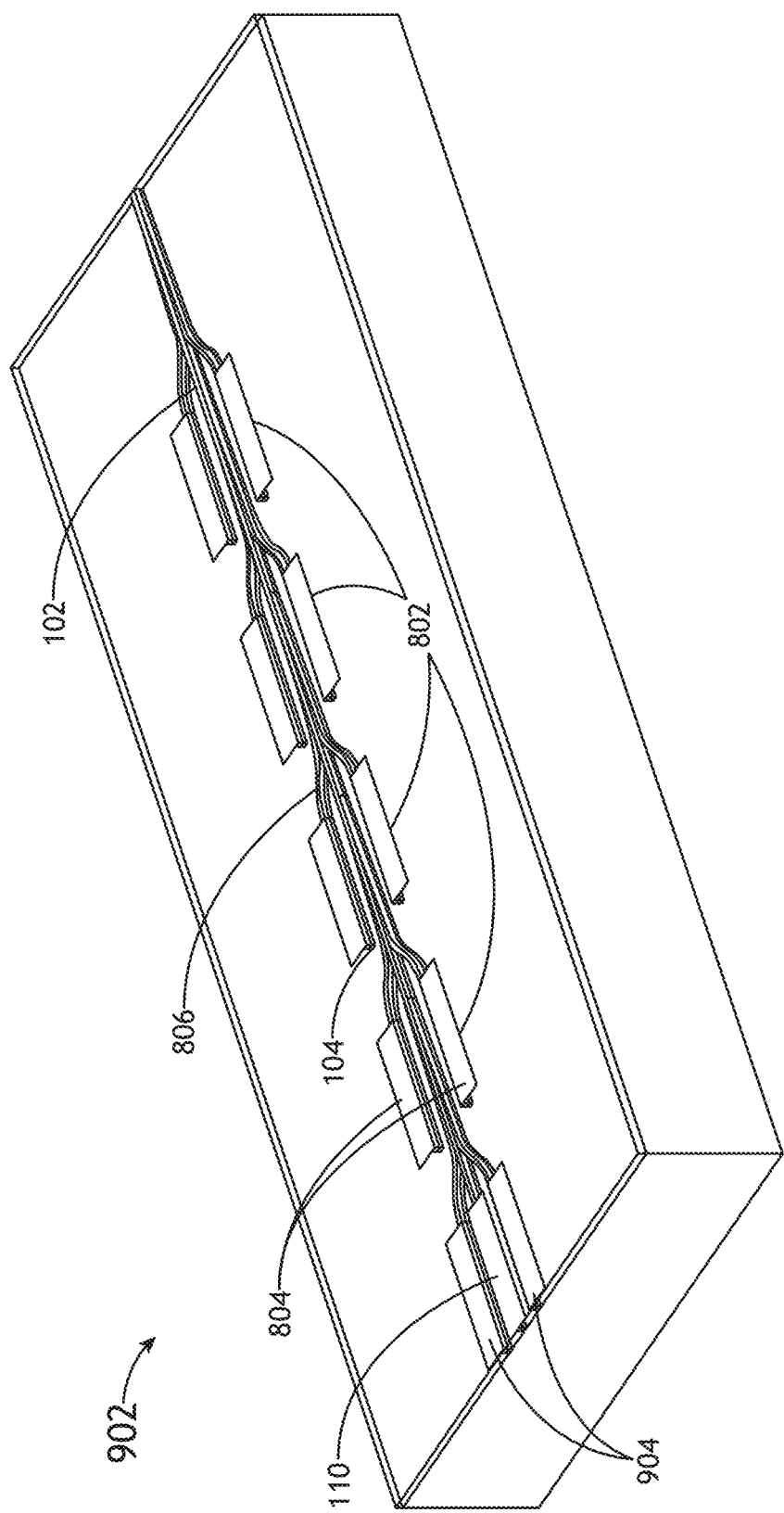
FIG. 9A is a laser source including the multi-stage P-SWA of FIG. 8A integrated with a signal source in accordance with one or more embodiments of the present disclosure.
Figure 9B:
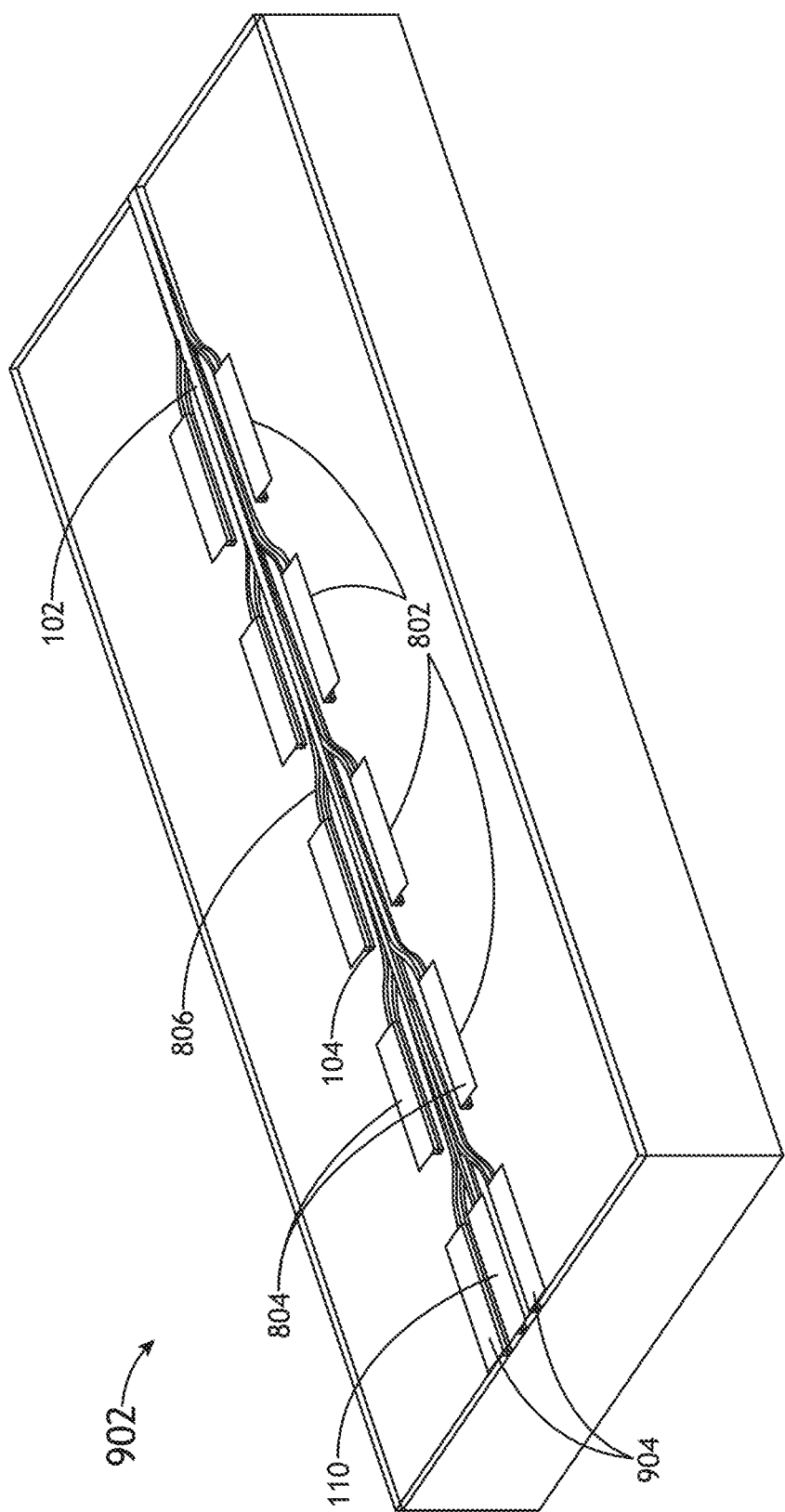
FIG. 9B is a laser source laser source including the multi-stage P-SWA of FIG. 8B integrated with a signal source in accordance with one or more embodiments of the present disclosure.

Referring now to FIGS. 9A and 9B, integrated laser sources 902 including one or more P-SWAs 100 are described in greater detail in accordance with one or more embodiments of the present disclosure. In one embodiment, one or more P-SWAs 100 are integrated with a signal source 110 and associated driving electrodes 904 on a common substrate to provide an amplified laser source in a compact package. Further, such amplified laser sources may be further integrated with additional components as part of a larger system or may be provided as standalone devices.

FIG. 9A is perspective view of a laser source 902 including the multi-stage P-SWA 100 of FIG. 8A integrated with a signal source 110 in accordance with one or more embodiments of the present disclosure. FIG. 9B is a perspective view of a laser source 902 including the multi-stage P-SWA 100 of FIG. 8B integrated with a signal source 110 in accordance with one or more embodiments of the present disclosure. In this regard, FIGS. 9A and 9B may illustrate variations of an integrated master oscillator power amplifier (MOPA) laser source 902.

However, it is to be understood that FIGS. 9A and 9B are provided solely for illustrative purposes and should not be interpreted as limiting. Rather, it is contemplated herein that any type of signal source 110 may be integrated with a P-SWA 100 using any technique known in the art. For example, the signal source 110 is not limited to the design illustrated in FIGS. 9A and 9B and may rather include any type of source known in the art suitable for generating signal light suitable for amplification by the amplifier waveguide 102. By way of another example, signal light 108 from a signal source 110 may be coupled into the amplifier waveguide 102 using direct coupling as illustrated in FIGS. 9A and 9B, through tapered waveguides (e.g., as illustrated in FIG. 9B), or by evanescent coupling. Further, an integrated laser source 902 may include any number or type of signal sources 110.

Referring now generally to FIG. 1A-9B, it is contemplated herein that a P-SWA 100 as disclosed herein may provide various benefits over existing technologies. For example, a P-SWA 100 may easily be integrated into photonic integrated circuits to make up for inevitable optical losses of passive and active components, which may provide one of the most effective ways to reach high-density large-scale photonic integrated circuits (PICs). By way of another example, a P-SWA 100 may provide flexibility in the number of quantum wells 122 in an invertible core 114, which may overcome the fundamental issue between power and noise figure in traditional electrically-pumped SOAs. Similarly, a P-SWA 100 may provide single-mode or few-mode operation. For instance, the invertible core 114 may be sufficiently thick to allow for few-mode propagation, which may be useful for, but is not limited to, free-space optical communications. By way of another example, a P-SWA 100 may provide a broad bandwidth. Since there is no need for electrical pumping, the gain peak of each quantum well 122 of a MQW invertible core 114 may be shifted so that the entire invertible core 114 may provide ultra-broad gain bandwidth. By way of another example, a P-SWA 100 may provide high-speed operation with no pattern effects. For instance, the carrier life time may be on the order of nanoseconds such that the P-SWA 100 may exhibit negligible pattern effects at high baud rates (e.g., 50 Gb/sec or higher). By way of another example, a P-SWA 100 may facilitate a variety of pumping schemes including, but not limited to, bidirectional pumping to optimize both noise figure and saturation power. By way of another example, a P-SWA 100 may be embedded or otherwise integrated into telecommunications systems. For instance, it may be cost effective to build in redundancy in such a system to mitigate downtime due to device component failures. With a P-SWA 100, several optical pump sources 104 can be included in the system to provide this redundancy. In this way, when one pump source 104 fails, another may be used instead to avoid the need for replacement of the P-SWA 100.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An optical amplifier comprising:
    an amplifier waveguide comprising:
        a core formed from one or more semiconductor layers configured to produce a population inversion when optically pumped; and
        one or more cladding layers surrounding one or more sides of the core, wherein pump light from one or more pump sources is guided by the core of the amplifier waveguide to induce the population inversion in the core, wherein signal light is guided by the core of the amplifier waveguide, wherein the core and the one or more cladding layers are configured to provide that an optical mode area of the signal light and an optical mode area of the pump light overlaps the core, wherein the signal light is amplified as it propagates through the amplifier waveguide and exits the amplifier waveguide as amplified signal light.

2. The optical amplifier of claim 1, wherein the core comprises:
    a quantum well core including one or more quantum well layers, wherein the one or more quantum well layers provide quantum confinement of carriers along a single dimension.

3. The optical amplifier of claim 2, wherein the quantum well core comprises:
    a multiple quantum well (MQW) core, wherein the one or more quantum well layers comprise two or more quantum well layers, wherein the two or more quantum well layers are separated by one or more barrier layers.

4. The optical amplifier of claim 3, wherein the two or more quantum well layers comprise at least five quantum well layers.

5. The optical amplifier of claim 3, wherein at least some of the two or more quantum well layers are strained to equalize a gain of the signal light with TM and TE polarizations within a selected tolerance.

6. The optical amplifier of claim 5, wherein the two or more quantum well layers are one of compressively strained or tensile strained, wherein the one or more barrier layers are the other of compressively strained or tensile strained.

7. The optical amplifier of claim 3, wherein a carrier density associated with the population inversion in each of the two or more quantum well layers is constant within a selected tolerance.

8. The optical amplifier of claim 2, wherein the quantum well core comprises:
    a single quantum well core (SQW) formed as a single quantum well layer.

9. The optical amplifier of claim 1, wherein the core comprises:
    one or more bulk semiconductor layers.

10. The optical amplifier of claim 1, wherein at least one of the one or more pump sources is an integrated pump laser comprising:
    a multilayer semiconductor structure integrated on a common substrate with the core and the one or more cladding layers.

11. The optical amplifier of claim 10, wherein the pump light from the integrated pump laser is coupled into the core through at least one of evanescent coupling or a tapered waveguide.

12. The optical amplifier of claim 1, wherein at least one of the one or more pump sources is external to the optical amplifier.

13. The optical amplifier of claim 12, wherein the pump light from at least one of the one or more pump sources is coupled into the amplifier waveguide through at least one of fiber coupling or free-space coupling.

14. The optical amplifier of claim 1, wherein the amplifier waveguide is bi-directionally pumped by the one or more pump sources.

15. The optical amplifier of claim 1, wherein the signal light is coupled into the amplifier waveguide from a passive waveguide integrated on a common substrate as the amplifier waveguide.

16. The optical amplifier of claim 1, wherein the signal light is coupled into the amplifier waveguide through at least one of fiber coupling or free-space coupling.

* * * * *